(12) United States Patent
Kim et al.

(10) Patent No.: US 9,786,558 B2
(45) Date of Patent: Oct. 10, 2017

(54) SEMICONDUCTOR DEVICES INCLUDING A BIT LINE STRUCTURE AND A CONTACT PLUG

(71) Applicant: Samsung Electronics Co., Ltd., Suwon-si, Gyeonggi-do (KR)

(72) Inventors: Kyung-Eun Kim, Seoul (KR); Hoon Jeong, Hwaseong-si (KR); Jae-Hyun Kim, Cheonan-si (KR); Dong-Won Lee, Seoul (KR); Jung-Gu Han, Anyang-si (KR); Ji-Hye Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/189,697

(22) Filed: Jun. 22, 2016

(65) Prior Publication Data

US 2016/0300763 A1    Oct. 13, 2016

Related U.S. Application Data

(63) Continuation-in-part of application No. 14/497,649, filed on Sep. 26, 2014, now Pat. No. 9,418,998.

(30) Foreign Application Priority Data

Feb. 7, 2014    (KR) .................. 10-2014-0014294

(51) Int. Cl.
| | |
|---|---|
| H01L 23/528 | (2006.01) |
| H01L 27/105 | (2006.01) |
| H01L 21/768 | (2006.01) |
| G11C 5/06 | (2006.01) |
| H01L 27/108 | (2006.01) |

(52) U.S. Cl.
CPC ........ H01L 21/76897 (2013.01); G11C 5/063 (2013.01); H01L 21/768 (2013.01); H01L 21/76895 (2013.01); H01L 23/528 (2013.01); H01L 27/1052 (2013.01); H01L 27/10814 (2013.01); H01L 27/10885 (2013.01)

(58) Field of Classification Search
CPC . G11C 5/063; H01L 21/76895; H01L 21/768; H01L 23/528; H01L 27/1052; H01L 27/10814; H01L 27/10885
See application file for complete search history.

(56) References Cited

U.S. PATENT DOCUMENTS

| | | |
|---|---|---|
| 8,012,881 B1 | 9/2011 | Lee et al. |
| 8,247,324 B2 | 8/2012 | Shin et al. |
| 2005/0202630 A1 | 9/2005 | Tran |
| 2005/0218458 A1 | 10/2005 | Kim et al. |
| 2006/0076600 A1 | 4/2006 | Nakabayashi et al. |
| 2007/0241380 A1 | 10/2007 | Hasunuma |

(Continued)

FOREIGN PATENT DOCUMENTS

JP    2011-171507    9/2011

*Primary Examiner* — Allen Parker
*Assistant Examiner* — Long H Le
(74) *Attorney, Agent, or Firm* — Myers Bigel, P.A.

(57) ABSTRACT

Semiconductor devices are provided. A semiconductor device includes a bit line structure and a contact plug. The contact plug is adjacent a sidewall of the bit line structure and is on a sloped surface of the bit line structure. Moreover, in some embodiments, a level of the sloped surface of the bit line structure becomes lower as the sloped surface approaches the sidewall of the bit line structure.

20 Claims, 46 Drawing Sheets

(56) References Cited

U.S. PATENT DOCUMENTS

| | | |
|---|---|---|
| 2010/0285644 A1 | 11/2010 | Lee et al. |
| 2011/0147889 A1 | 6/2011 | Tsuchiya |
| 2012/0139028 A1 | 6/2012 | Park et al. |
| 2012/0168899 A1* | 7/2012 | Kim .................... H01L 21/7682 |
| | | 257/522 |
| 2012/0248519 A1 | 10/2012 | Shinhara |
| 2012/0273859 A1 | 11/2012 | Oyu et al. |
| 2012/0276711 A1* | 11/2012 | Yoon .................... H01L 21/764 |
| | | 438/421 |
| 2012/0286358 A1 | 11/2012 | Sammi |
| 2013/0009226 A1 | 1/2013 | Park et al. |
| 2014/0306351 A1* | 10/2014 | Kim ................ H01L 21/76855 |
| | | 257/774 |
| 2015/0021683 A1* | 1/2015 | Xie .................... H01L 29/6653 |
| | | 257/330 |

\* cited by examiner

SEMICONDUCTOR DEVICES INCLUDING A BIT LINE STRUCTURE AND A CONTACT PLUG

CROSS-REFERENCE TO RELATED APPLICATIONS

The present application is a continuation application of and claims priority from U.S. patent application Ser. No. 14/497,649, filed on Sep. 26, 2014, which claims priority under 35 U.S.C. §119 to Korean Patent Application No. 10-2014-0014294, filed on Feb. 7, 2014, the disclosure of which is hereby incorporated by reference herein in its entirety.

BACKGROUND

The present disclosure relates to semiconductor devices. A semiconductor device may include bit line structures and storage contact plugs. The storage contact plugs may be adjacent the bit line structures. Each of the storage contact plugs may cover a portion of an upper surface of adjacent bit lien structure. The structure of the storage contact plugs, however, may impair the reliability of the semiconductor device.

SUMMARY

Various embodiments of present inventive concepts may provide a semiconductor device in which a storage contact plug partially covers an upper surface of a bit line structure and has a sufficient thickness overall. Moreover, various embodiments of present inventive concepts may provide a semiconductor device in which adjacent storage contact plugs are sufficiently spaced apart from each other.

Various embodiments of present inventive concepts provide a semiconductor device. The semiconductor device may include a semiconductor substrate and a bit line structure on the semiconductor substrate. The bit line structure may include a first upper surface near a first sidewall of the bit line structure and a second upper surface near a second sidewall of the bit line structure, where the second sidewall is opposite the first sidewall. Moreover, the semiconductor device may include a storage contact plug that is adjacent the first sidewall of the bit line structure. The storage contact plug may extend over the first upper surface of the bit line structure, and the first upper surface of the bit line structure may slope downward toward the first sidewall of the bit line structure.

In various embodiments, a first profile of a lower surface of the storage contact plug that faces the first upper surface of the bit line structure may correspond to a second profile of the first upper surface of the bit line structure. In some embodiments, the first upper surface of the bit line structure may be more gradually sloped closer to the first sidewall of the bit line structure and may be more steeply sloped distal from the first sidewall of the bit line structure. Moreover, a shape of the first upper surface of the bit line structure may be a curved (e.g., a demand curve) shape.

According to various embodiments, the storage contact plug may include an upper plug pad that overlies the first upper surface of the bit line structure. Moreover, the storage contact plug may include a plug barrier pattern that is between the first upper surface of the bit line structure and the upper plug pad. The plug barrier pattern may extend along a sidewall of the upper plug pad. In some embodiments, an upper surface of the plug barrier pattern may be coplanar with an upper surface of the upper plug pad. In some embodiments, the semiconductor device may include an interlayer insulating film on the second upper surface of the bit line structure, and a first lowest level of the interlayer insulating film may be lower than a second lowest level of the plug barrier pattern. Moreover, in some embodiments, an upper surface of the interlayer insulating film may be coplanar with an upper surface of the plug barrier pattern.

In various embodiments, the second upper surface of the bit line structure may slope downward toward the second sidewall of the bit line structure, and first and second shapes of the first and second upper surfaces of the bit line structure, respectively, may be asymmetrical with respect to each other. In some embodiments, a first horizontal length (e.g., in a direction parallel to a surface of the semiconductor substrate) of the second upper surface of the bit line structure may be shorter than a second horizontal length of the first upper surface of the bit line structure. Moreover, in some embodiments, the second sidewall of the bit line structure may extend a first distance from a surface of the semiconductor substrate that is shorter than a second distance from the surface of the semiconductor substrate that the first sidewall of the bit line structure extends.

According to various embodiments, the semiconductor device may include a bit line spacer that is between the first sidewall of the bit line structure and a portion of the storage contact plug. An upper surface of the bit line spacer may be connected with the first upper surface of the bit line structure.

A semiconductor device, according to various embodiments, may include a semiconductor substrate and a first bit line structure on the semiconductor substrate. The semiconductor device may include a second bit line structure that is on the semiconductor substrate and is spaced apart from the first bit line structure. Moreover, the semiconductor device may include a storage contact plug that is between the first bit line structure and the second bit line structure. The storage contact plug may extend along an upper surface of the first bit line structure, and a shape of a lower surface of the storage contact plug that faces the upper surface of the first bit line structure may be a sloped shape.

In various embodiments, a semiconductor device may include a bit line spacer that is between a sidewall of the second bit line structure and a first portion of the storage contact plug. The semiconductor device may include an interlayer insulating film that is on the bit line spacer. Moreover, the semiconductor device may include a plug separation spacer that is between the bit line spacer and a second portion of the storage contact plug. An upper surface of the plug separation spacer may contact a lower surface of the interlayer insulating film. In some embodiments, the upper surface of the plug separation spacer may be connected with an upper surface of the bit line spacer.

A semiconductor device, according to various embodiments, may include first and second bit line structures. Moreover, the semiconductor device may include a contact plug having a first portion between the first and second bit line structures and having a sloped second portion on a sloped surface of the first bit line structure. In some embodiments, the sloped surface of the first bit line structure may be a sloped upper surface of the first bit line structure. Moreover, in some embodiments, the semiconductor device may include a spacer between the first portion of the contact plug and the second bit line structure.

In various embodiments, the contact plug may be a first contact plug, the spacer may be a first spacer, and the semiconductor device may include a second spacer that overlies the first portion of the first contact plug. The second spacer may have an upper surface that is connected to an upper surface of the first spacer. Moreover, the semiconductor device may include a second contact plug that is on a sloped surface of the second bit line structure, and the first and second spacers may be between the first and second contact plugs.

According to various embodiments, the first bit line structure may have a first sidewall and a second sidewall that is opposite the first sidewall. The sloped upper surface of the first bit line structure may be a first sloped upper surface that slopes downward toward the first sidewall. The bit line structure may include a second sloped upper surface that converges with the first sloped upper surface at a convergence point and slopes downward from the convergence point toward the second sidewall. Moreover, first and second shapes of the first and second sloped upper surfaces of the first bit line structure, respectively, may be asymmetrical with respect to each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1A:
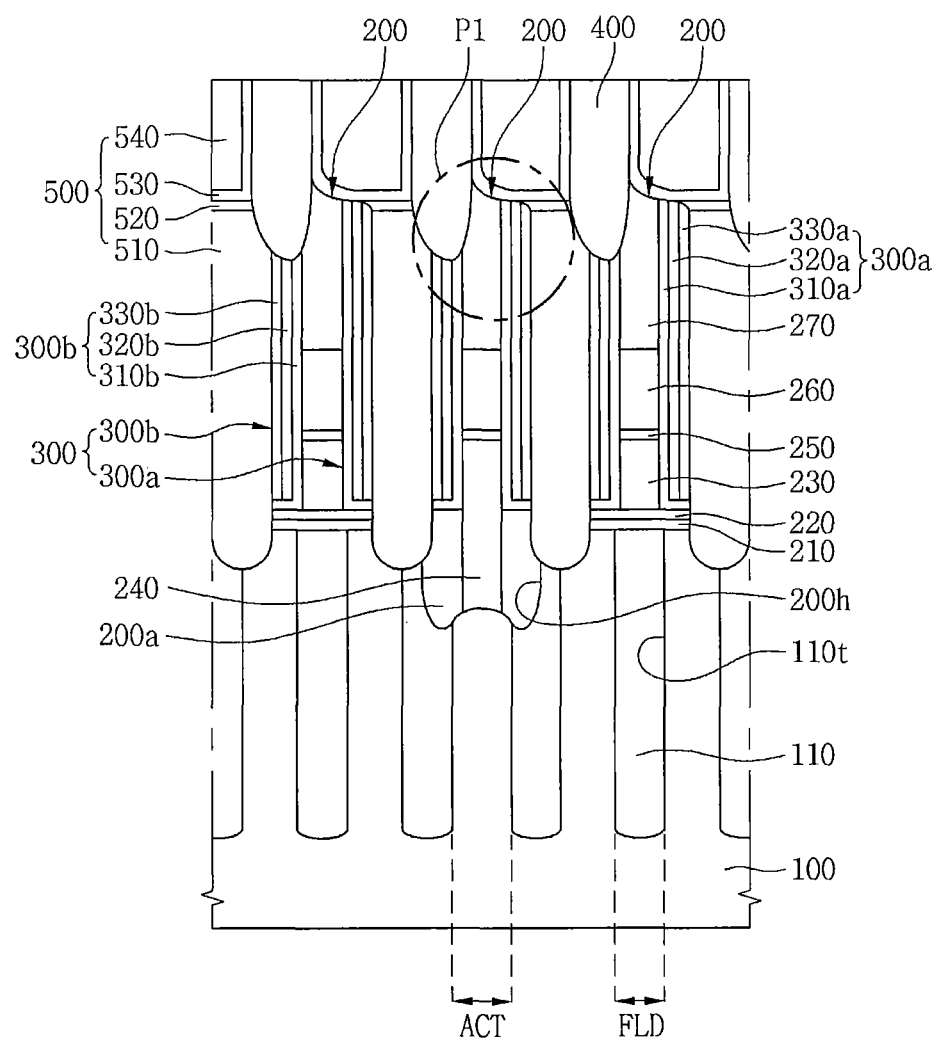
FIG. 1A is a sectional view illustrating a semiconductor device according to some embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
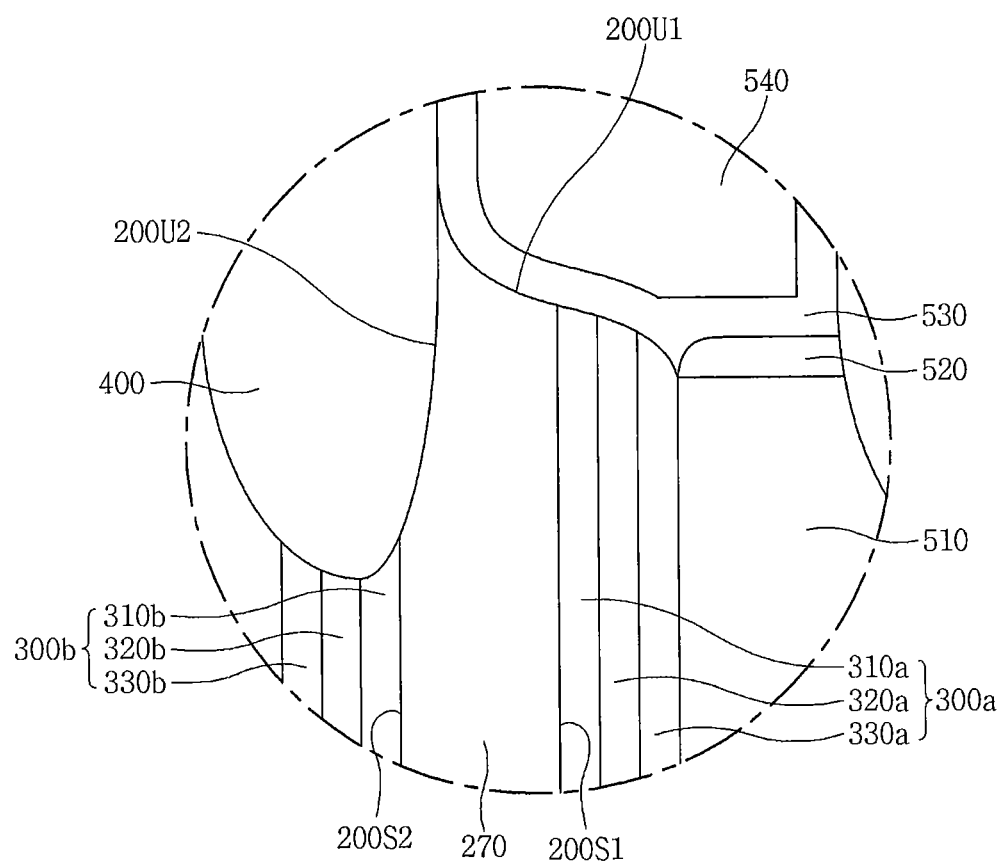
FIG. 1B is a partially enlarged view of P1 area of FIG. 1A.

FIG. 1A is a sectional view illustrating a semiconductor device according to some embodiments of present inventive concepts. FIG. 1B is a partially enlarged view of P1 area of FIG. 1A.

Referring to FIGS. 1A and 1B, a semiconductor device according to some embodiments of present inventive concepts may include a semiconductor substrate 100, bit line structures 200, bit line spacers 300, interlayer insulating films 400, and storage contact plugs 500.

The semiconductor substrate 100 may include a silicon substrate or a silicon-on-insulator (SOI) substrate. The semiconductor substrate 100 may include an active region ACT and a field region FLD.

The active region ACT may be defined by the field region FLD. The field region FLD may surround the active region ACT. The field region FLD may include a field trench 110t and a field insulator 110.

The field trench 110t may be disposed in the semiconductor substrate 100. The field insulator 110 may be disposed in the field trench 110t. The field insulator 110 may include an insulating material. For example, the field insulator 110 may include silicon oxide.

The bit line structures 200 may be disposed on the semiconductor substrate 100. Each of the bit line structures 200 may include a lower bit line barrier pattern 210, an upper bit line barrier pattern 220, a lower bit line electrode 230, a bit line plug 240, a middle bit line pattern 250, an upper bit line electrode 260, and a bit line capping pattern 270.

The lower bit line barrier pattern 210 may be disposed on an upper surface of the semiconductor substrate 100. The lower bit line barrier pattern 210 may include an insulating material. For example, the lower bit line barrier pattern 210 may include silicon oxide.

The upper bit line barrier pattern 220 may be disposed on the lower bit line barrier pattern 210. The upper bit line barrier pattern 220 may include an insulating material. An etching rate of the upper bit line barrier pattern 220 may be different from an etching rate of the lower bit line barrier pattern 210. For example, the upper bit line barrier pattern 220 may include silicon nitride.

The lower bit line electrode 230 may be disposed on the upper bit line barrier pattern 220. The lower bit line electrode 230 may include a conductive material. For example, the lower bit line electrode 230 may include polycrystalline silicon.

The bit line plug 240 may be disposed on the active region ACT intersecting the corresponding bit line structure 200. The bit line plug 240 may be in direct contact with the active region ACT. The lowest level of the bit line plug 240 may be lower than a level of an upper surface of the semiconductor substrate 100.

The bit line plug 240 may extend inside a plug contact hole 200h which is disposed in the semiconductor substrate 100. A plug insulating film 200a may be disposed in the plug contact hole 200h. The bit line plug 240 may penetrate the plug insulating film 200a.

The highest level of the bit line plug 240 may be the same as a level of an upper surface of the lower bit line electrode 230. The bit line plug 240 may penetrate the lower bit line barrier pattern 210, the upper bit line barrier pattern 220, and the lower bit line electrode 230.

The bit line plug 240 may include a conductive material. For example, the bit line plug 240 may include polycrystalline silicon.

The middle bit line pattern 250 may be disposed on the lower bit line electrode 230. The middle bit line pattern 250 may be disposed on the bit line plug 240. For example, the middle bit line pattern 250 may include metal silicide.

The upper bit line electrode 260 may be disposed on the middle bit line pattern 250. The upper bit line electrode 260 may include a conductive material. For example, the upper bit line electrode 260 may include a metal.

The bit line capping pattern 270 may be disposed on the upper bit line electrode 260. The bit line capping pattern 270 may include an insulating material. For example, the bit line capping pattern 270 may include silicon nitride.

The bit line capping pattern 270 may include a first upper surface 200U1 and a second upper surface 200U2.

The first upper surface 200U1 of the bit line capping pattern 270 may be disposed near a first side 200S1 of a corresponding bit line structure 200. A level of the first upper surface 200U1 may be lower closer to (e.g., lower as it approaches) the first side 200S1 of the corresponding bit line structure 200. In other words, the first upper surface 200U1 may slope downward toward the first side 200S1. Moreover, the level of the first upper surface 200U1 may be more gradually sloped closer to the first side 200S1 of the corresponding bit line structure 200. For example, a shape of the first upper surface 200U1 may be a demand curve shape (e.g., may slope downward from left to right) and may be more steeply sloped distal from the first side 200S1. Accordingly, the first upper surface 200U1 may be referred to as a sloped and/or curved surface.

The second upper surface 200U2 of the bit line capping pattern 270 may be disposed near a second side 200S2 of a corresponding bit line structure 200. The second side 200S2 of the bit line structure 200 may be opposite the first side 200S1 of the corresponding bit line structure 200.

A level of the second upper surface 200U2 may be lower closer to (e.g., lower as it approaches) the second side 200S2 of the corresponding bit line structure 200. A shape of the second upper surface 200U2 may be different from a shape of the first upper surface 200U1. The second upper surface 200U2 and the first upper surface 200U1 may be asymmetric.

A horizontal length of the second upper surface 200U2 may be shorter than a horizontal length of the first upper surface 200U1. A vertical length between the highest level and the lowest level of the second upper surface 200U2 may be longer than that between the highest level and the lowest level of the first upper surface 200U1. The highest level of the second upper surface 200U2 may be the same as the highest level of the first upper surface 200U1. The highest level of the second side 200S2 of each of the bit line structures 200 may be lower than the highest level of the first side 200S1 of the corresponding bit line structures 200.

The bit line spacers 300 may be disposed on the sides of the bit line structures 200. Each of the bit line spacers 300 may include a first bit line spacer 300a and a second bit line spacer 300b.

The first bit line spacer 300a may be disposed on the first side 200S1 of each of the bit line structures 200. The first side 200S1 of each of the bit line structures 200 may be covered by a corresponding first bit line spacer 300a.

A level of an upper surface of the first bit line spacer 300a may be lower far away (e.g., distal) from the first side 200S1 of the corresponding bit line structure 200. The level of the upper surface of the first bit line spacer 300a may be more gradually sloped closer to the first side 200S1 of the corresponding bit line structure 200. The upper surface of the first bit line spacer 300a may be connected (e.g., to form a continuous surface) with the first upper surface 200U1 of the corresponding bit line structure 200.

The first bit line spacer 300a may include a first inner bit line spacer 310a, a first middle bit line spacer 320a, and a first outer bit line spacer 330a.

The first inner bit line spacer 310a may be disposed near the first side 200S1 of a corresponding bit line structure 200. The first side 200S1 of the bit line structure 200 may be surrounded by a corresponding first inner bit line spacer 310a. The first inner bit line spacer 310a may extend horizontally to overlap the upper surface of the semiconductor substrate 100. For example, the first inner bit line spacer 310a may have a "L" shape.

The first inner bit line spacer 310a may include an insulating material. For example, the first inner bit line spacer 310a may include silicon nitride.

The first middle bit line spacer 320a may be disposed on the first inner bit line spacer 310a. For example, the first middle bit line spacer 320a may be disposed on a horizontal region of the first inner bit line spacer 310a.

The first middle bit line spacer 320a may include an insulating material. The first middle bit line spacer 320a may have an etching selectivity with respect to the first inner bit line spacer 310a. An etching rate of the first middle bit line spacer 320a may be different from that of the first inner bit line spacer 310a. For example, the first middle bit line spacer 320a may include silicon oxide.

The first outer bit line spacer 330a may be disposed on the first middle bit line spacer 320a. The first outer bit line spacer 330a may be disposed on a horizontal region of the first inner bit line spacer 310a. For example, a top surface of the horizontal region of the first inner bit line spacer 310a may contact a bottom surface of the first outer bit line spacer 330a.

The first outer bit line spacer 330a may include an insulating material. An etching rate of the first outer bit line spacer 330a may be different from that of the first middle bit line spacer 320a. For example, the first outer bit line spacer 330a may include silicon nitride.

The second bit line spacer 300b may be disposed on the second side 200S2 of each of the bit line structures 200. The second side 200S2 of each of the bit line structures 200 may be covered by a corresponding second bit line spacer 300b.

A shape of an upper surface of the second bit line spacer 300b may be a concave shape. An upper surface of the second bit line spacer 300b may be connected (e.g., to form a continuous surface) with the second upper surface 200U2 of the corresponding bit line structure 200.

The second bit line spacer 300b may include a second inner bit line spacer 310b, a second middle bit line spacer 320b, and a second outer bit line spacer 330b.

The second inner bit line spacer 310b may be disposed near the second side 200S2 of a corresponding bit line structure 200. The second inner bit line spacer 310b may extend horizontally to overlap the upper surface of the semiconductor substrate 100. For example, the second inner bit line spacer 310b may have a reverse (e.g., backward) "L" shape.

The second inner bit line spacer 310b may include an insulating material. An etching rate of the second inner bit line spacer 310b may be the same as that of the first inner bit line spacer 310a. For example, the second inner bit line spacer 310b may include silicon nitride.

The second middle bit line spacer 320b may be disposed on the second inner bit line spacer 310b. For example, the second middle bit line spacer 320b may be disposed on a horizontal region of the second inner bit line spacer 310b.

The second middle bit line spacer 320b may include an insulating material. The second middle bit line spacer 320b may have an etching selectivity with respect to the second inner bit line spacer 310b. For example, the second middle bit line spacer 320b may include silicon oxide.

The second outer bit line spacer 330b may be disposed on the second middle bit line spacer 320b. The second outer bit line spacer 330b may be disposed on a horizontal region of the second inner bit line spacer 310b. For example, a top surface of the horizontal region of the second inner bit line spacer 310b may contact a bottom surface of the second outer bit line spacer 330b.

The second outer bit line spacer 330b may include an insulating material. The second outer bit line spacer 330b may have an etching selectivity with respect to the second middle bit line spacer 320b. For example, the second outer bit line spacer 330b may include silicon nitride.

Each of the interlayer insulating films 400 may be disposed on the second upper surface 200U2 of the bit line capping pattern 270 of each of the bit line structures 200. Each of the interlayer insulating films 400 may be disposed on an upper surface of each of the second bit line spacers 300b.

Each of the interlayer insulating films 400 may be in direct contact with the second upper surface 200U2 of each of the bit line structures 200. Each of the interlayer insulating films 400 may be in direct contact with an upper surface of each of the second bit line spacers 300b. A profile of a lower surface of each of the interlayer insulating films 400 may be the same as a profile formed by the second upper surface 200U2 of each of the bit line structures 200 and the upper surface of each of the second bit line spacers 300b.

The lowest level of the interlayer insulating films 400 may be lower than the lowest level of the upper surface of the first bit line spacer 300a. The highest level of the upper surface of the second bit line spacer 300b may be lower than the lowest level of the upper surface of the first bit line spacer 300a.

A level of an upper surface of each of the interlayer insulating films 400 may be higher than the highest level of each of the bit line structures 200. The level of the upper surface of each of the interlayer insulating films 400 may be higher than the highest level of the first upper surface 200U1 of each of the bit line structures 200.

The interlayer insulating films 400 may include an insulating material. For example, the interlayer insulating films 400 may include silicon nitride.

The storage contact plugs 500 may be disposed between the bit line spacers 300. The storage contact plugs 500 may be disposed between the interlayer insulating films 400. A level of an upper surface of the storage contact plugs 500 may be the same as a level of the upper surface of the interlayer insulating films 400.

The storage contact plugs 500 may cover upper surfaces of the first bit line spacers 300a. The storage contact plugs 500 may be extended along the upper surfaces of the first bit line spacers 300a. A profile of a lower surface of the storage contact plug 500 that faces the upper surface of the first bit line spacer 300a may be the same as a profile of the upper surface of the first bit line spacer 300a.

The storage contact plug 500 may cover the first upper surface 200U1 of the bit line structure 200. The storage contact plug 500 may be extended along the first upper surface 200U1 of the bit line structure 200. A profile of the lower surface of the storage contact plug 500 that faces the first upper surface 200U1 of the bit line structure 200 may be the same as a profile of the first upper surface 200U1 of the bit line structure 200.

In the semiconductor device according to some embodiments of present inventive concepts, the level of the first upper surface 200U1 of the bit line structure 200 may be lower closer to the first side 200S1 of the corresponding bit line structure 200. In the semiconductor device according to some embodiments of present inventive concepts, the storage contact plug 500 may be extended along the first upper surface 200U1 of the bit line structure 200. Accordingly, in the semiconductor device according to some embodiments of present inventive concepts, a shape of the lower surface of the storage contact plug 500 that faces the first upper surface 200U1 of the bit line structure 200 may be a convex shape. That is, in the semiconductor device according to some embodiments of present inventive concepts, a thickness of the storage contact plug 500 can be sufficiently secured between the bit line structure 200 and the interlayer insulating film 400. Accordingly, reliability of the semiconductor device according to some embodiments of present inventive concepts can be improved.

Each of the storage contact plugs 500 may include a lower plug pad 510, a middle plug pad 520, a plug barrier pattern 530, and an upper plug pad 540.

The lower plug pad 510 may be disposed between the bit line spacers 300. The lowest level of the lower plug pad 510 may be lower than the level of the upper surface of the semiconductor substrate 100. The lower plug pad 510 may be in direct contact with the active region ACT.

A level of an upper surface of the lower plug pad 510 may be lower than the highest level of the bit line capping pattern 270. The level of the upper surface of the lower plug pad 510 may be lower than the highest level of the first bit line spacer 300a. The level of the upper surface of the lower plug pad 510 may be higher than the level of the upper surface of the upper bit line electrode 260. The level of the upper surface of the lower plug pad 510 may be higher than the lowest level of the interlayer insulating film 400.

The lower plug pad 510 may include a conductive material. For example, the lower plug pad 510 may include polycrystalline silicon.

The middle plug pad 520 may be disposed on the upper surface of the lower plug pad 510. The upper surface of the lower plug pad 510 may be fully covered by the middle plug pad 520. For example, the middle plug pad 520 may include metal silicide.

The plug barrier pattern 530 may be disposed on the middle plug pad 520. The plug barrier pattern 530 may be extended along the first upper surface 200U1 of an adjacent bit line structure 200. The plug barrier pattern 530 may be extended along a side of an adjacent interlayer insulating film 400. The highest level of the plug barrier pattern 530 may be the same as the level of the upper surface of the interlayer insulating film 400.

The plug barrier pattern 530 may include a refractory metal. For example, the plug barrier pattern 530 may include metal oxide or metal nitride.

The upper plug pad 540 may be disposed on the plug barrier pattern 530. The upper plug pad 540 may be disposed on the first upper surface 200U1 of an adjacent bit line structure 200. The first upper surface 200U1 of the bit line structure 200 may be vertically overlapped with the upper plug pad 540 of the storage contact plug 500.

A level of an upper surface of the upper plug pad 540 may be the same as a level of the upper surface of the interlayer insulating film 400. The level of the upper surface of the upper plug pad 540 may be the same as the highest level of the plug barrier pattern 530. The plug barrier pattern 530 may be extended along a side of the upper plug pad 540. The upper plug pad 540 may fill a region between vertical regions of the plug barrier pattern 530.

The upper plug pad 540 may include a conductive material. For example, the upper plug pad 540 may include a metal.

Figure 2A:
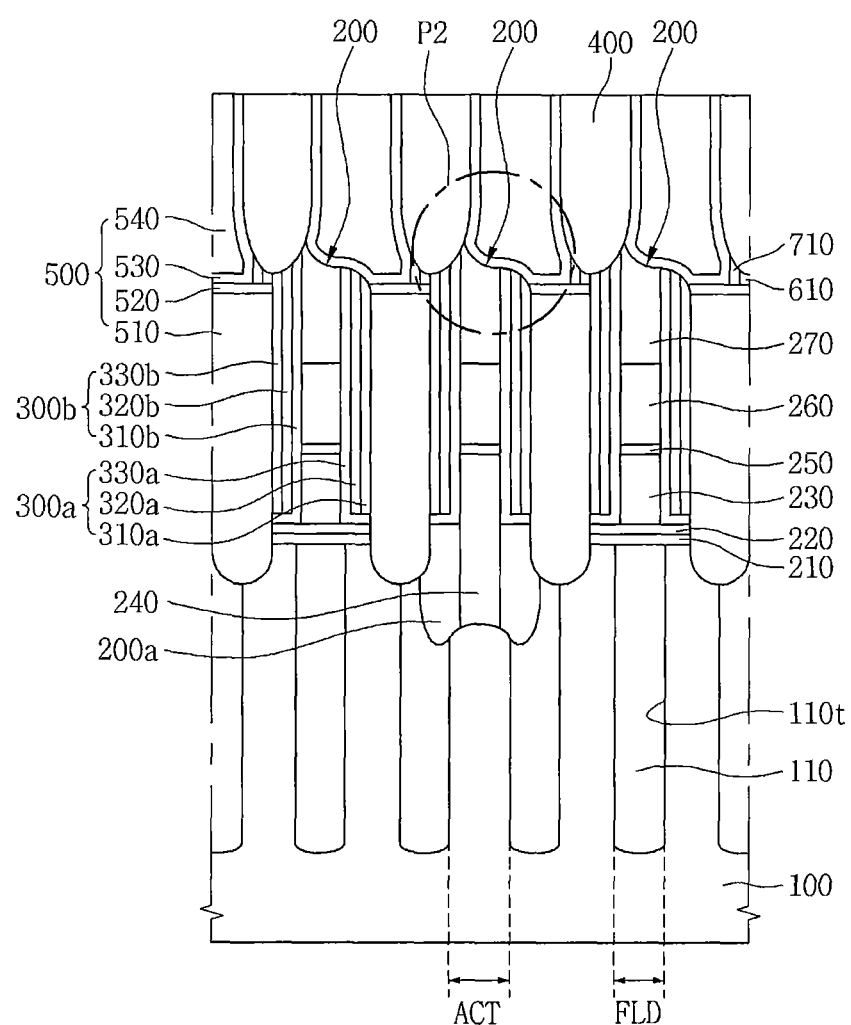
FIG. 2A is a sectional view illustrating a semiconductor device according to some embodiments of present inventive concepts.
Figure 2B:
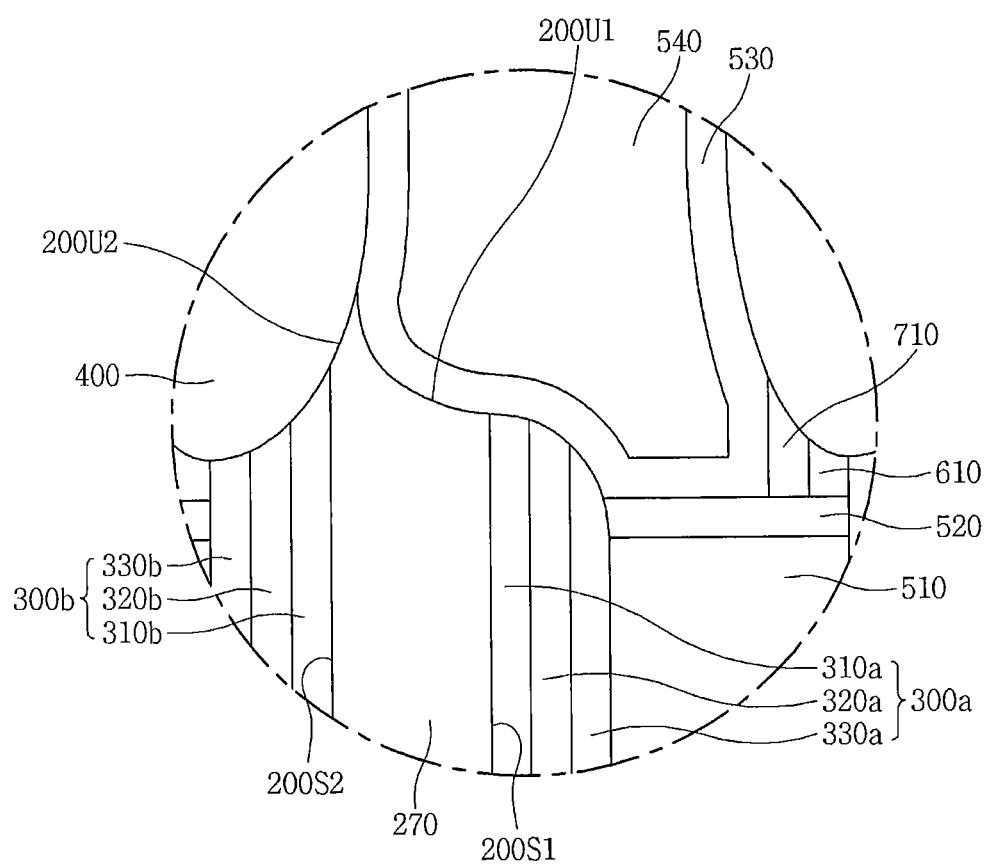
FIG. 2B is a partially enlarged view of P2 area of FIG. 2A.

FIG. 2A is a sectional view illustrating a semiconductor device according to some embodiments of present inventive concepts. FIG. 2B is a partially enlarged view of P2 area of FIG. 2A.

Referring to FIGS. 2A and 2B, a semiconductor device according to some embodiments of present inventive concepts may include a semiconductor substrate 100, bit line structures 200, first bit line spacers 300a, second bit line spacers 300b, interlayer insulating films 400, storage contact plugs 500, first plug separation spacers 610, second plug separation spacers 710.

The semiconductor substrate 100 may include an active region ACT and a field region FLD. The field region FLD may include a field trench 110t and a field insulator 110.

Each of the bit line structures 200 may include a lower bit line barrier pattern 210, an upper bit line barrier pattern 220, a lower bit line electrode 230, a bit line plug 240, a middle bit line pattern 250, an upper bit line electrode 260, and a bit line capping pattern 270.

Each of the bit line structures 200 may include a first upper surface 200U1 and a second upper surface 200OU2. As a level of the first upper surface 200U1 of each of the bit line structures 200 is closer to a first side 200S1 of a corresponding bit line structure 200, the level of the first upper surface 200U1 of each of the bit line structures 200 becomes lower. As a level of the second upper surface 200U2 of each of the bit line structures 200 is closer to a second side 200S2 of a corresponding bit line structure 200, the level of the second upper surface 200U2 of each of the bit line structures 200 becomes lower.

The highest level of the first side 200S1 of the bit line structures 200 may be lower than the highest level of the second side 200S2 of the bit line structures 200. The highest level of the first side 200S1 of the bit line structures 200 may be higher than the lowest level of the interlayer insulating film 400.

Each of the first bit line spacers 300a may be disposed on the first side 200S1 of the bit line structures 200. Each of the first bit line spacers 300a may include a first inner bit line spacer 310a, a first middle bit line spacer 320a, and a first outer bit line spacer 330a.

Each of the second bit line spacers 300b may be disposed on the second side 200S2 of the bit line structures 200. Each of the second bit line spacers 300b may include a second inner bit line spacer 310b, a second middle bit line spacer 320b, and a second outer bit line spacer 330b.

Each of the storage contact plugs 500 may include a lower plug pad 510, a middle plug pad 520, a plug barrier pattern 530, and an upper plug pad 540. A level of an upper surface of the lower plug pad 510 may be lower than the lowest level of the interlayer insulating film 400.

Each of the first plug separation spacers 610 may be disposed on each of the second bit line spacers 300b. Each of the first plug separation spacers 610 may be disposed on the middle plug pad 520 of each of the storage contact plugs 500.

An upper surface of each of the first plug separation spacers 610 may be in direct contact with each of the interlayer insulating films 400. The upper surface of each of the first plug separation spacers 610 may be connected (e.g., to form a continuous surface) with an upper surface of each of the second bit line spacers 300b.

The first plug separation spacers 610 may include an insulating material. For example, the first plug separation spacers 610 may include silicon nitride.

Each of the second plug separation spacers 710 may be disposed on each of the first plug separation spacers 610. Each of the second plug separation spacers 710 may be disposed on each of the middle plug pads 520. The second plug separation spacer 710 may be disposed among the interlayer insulating film 400, the middle plug pad 520, the plug barrier pattern 530, and the first plug separation spacer 610.

An upper surface of each of the second plug separation spacers 710 may be in direct contact with the interlayer insulating film 400. The upper surface of each of the second plug separation spacers 710 may be connected (e.g., to form a continuous surface) with the upper surface of each of the first plug separation spacers 610.

The second plug separation spacer 710 may include an insulating material. An etch rate of the second plug separation spacer 710 may be different from that of the first plug separation spacer 610. For example, the second plug separation spacer 710 may include silicon oxide.

In the semiconductor device according to some embodiments of present inventive concepts, the first plug separation spacers 610 and the second plug separation spacers 710 may be disposed below the interlayer insulating films 400. Accordingly, in the semiconductor device according to some embodiments of present inventive concepts, adjacent storage contact plugs 500 can be fully spaced apart from each other. Therefore, reliability of the semiconductor device according to some embodiments of present inventive concepts can be improved.

Figure 3A:
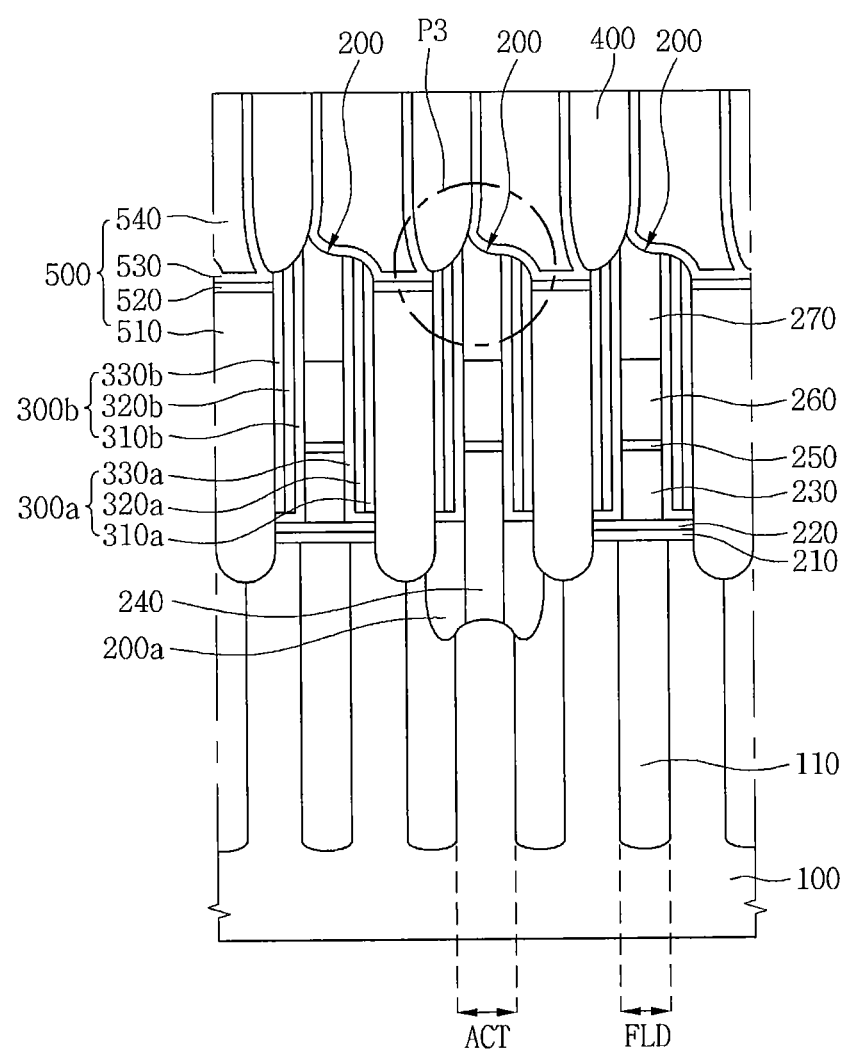
FIG. 3A is a sectional view illustrating a semiconductor device according to some embodiments of present inventive concepts.
Figure 3B:
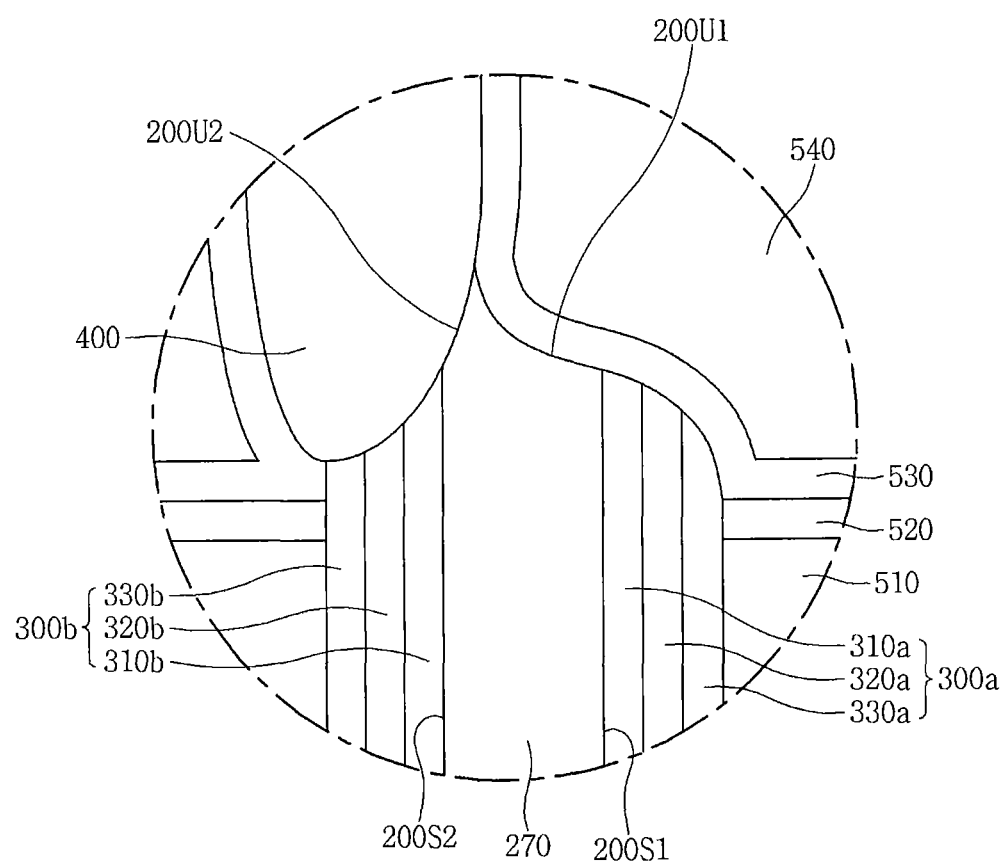
FIG. 3B is a partially enlarged view of P3 area of FIG. 3A.

FIG. 3A is a sectional view illustrating a semiconductor device according to some embodiments of present inventive concepts. FIG. 3B is a partially enlarged view of P3 area of FIG. 3A.

Referring to FIGS. 3A and 3B, a semiconductor device according to some embodiments of present inventive concepts may include a semiconductor substrate 100 including an active region ACT and a field region FLD, bit line structures 200 including a lower bit line barrier pattern 210, an upper bit line barrier pattern 220, a lower bit line electrode 230, a bit line plug 240, a middle bit line pattern 250, an upper bit line electrode 260, and a bit line capping pattern 270, first bit line spacers 300a including a first inner bit line spacer 310a, a first middle bit line spacer 320a, and a first outer bit line spacer 330a, second bit line spacers 300b including a second inner bit line spacer 310b, a second middle bit line spacer 320b, and a second outer bit line spacer 330b, an interlayer insulating film 400, and storage contact plugs 500 including a lower plug pad 510, a middle plug pad 520, a plug barrier pattern 530, and an upper plug pad 540.

The lowest level of an upper surface of the first bit line spacer 300a may be lower than the lowest level of an upper surface of the second bit line spacer 300b. A level of an upper surface of the lower plug pad 510 may be lower than the lowest level of the interlayer insulating film 400. The lower plug pad 510 may surround a side and a lower surface of the interlayer insulating film 400.

Figure 4A:
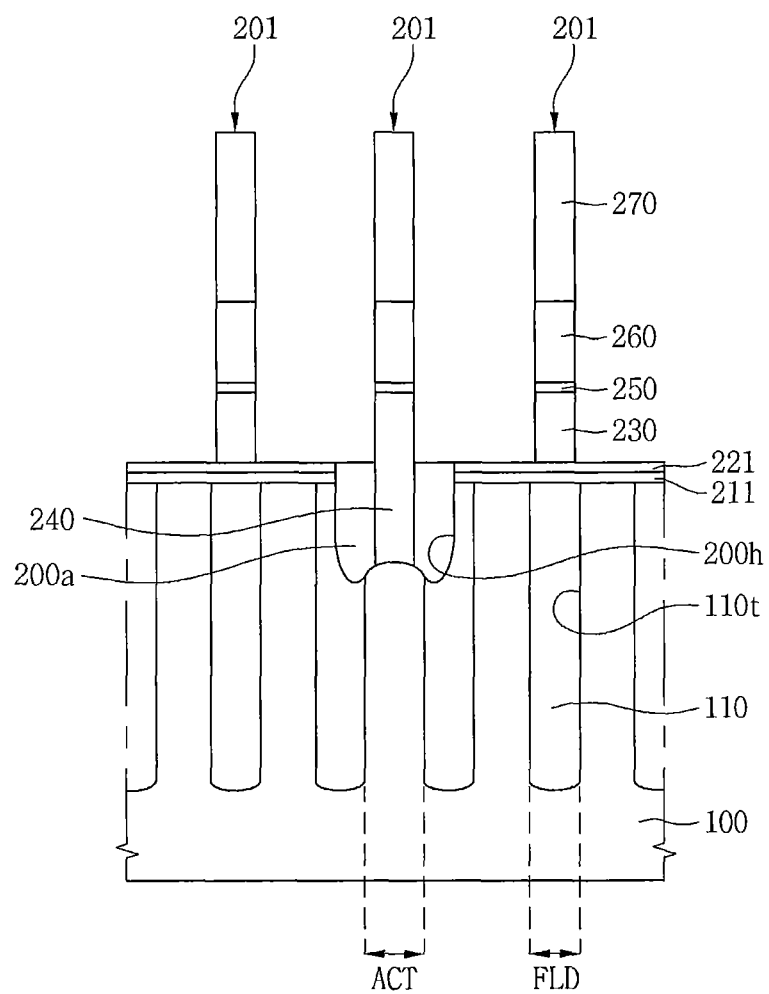
FIGS. 4A to 4Q are sequential sectional views illustrating a method of forming a semiconductor device sequentially according to some embodiments of present inventive concepts.
Figure 4B:
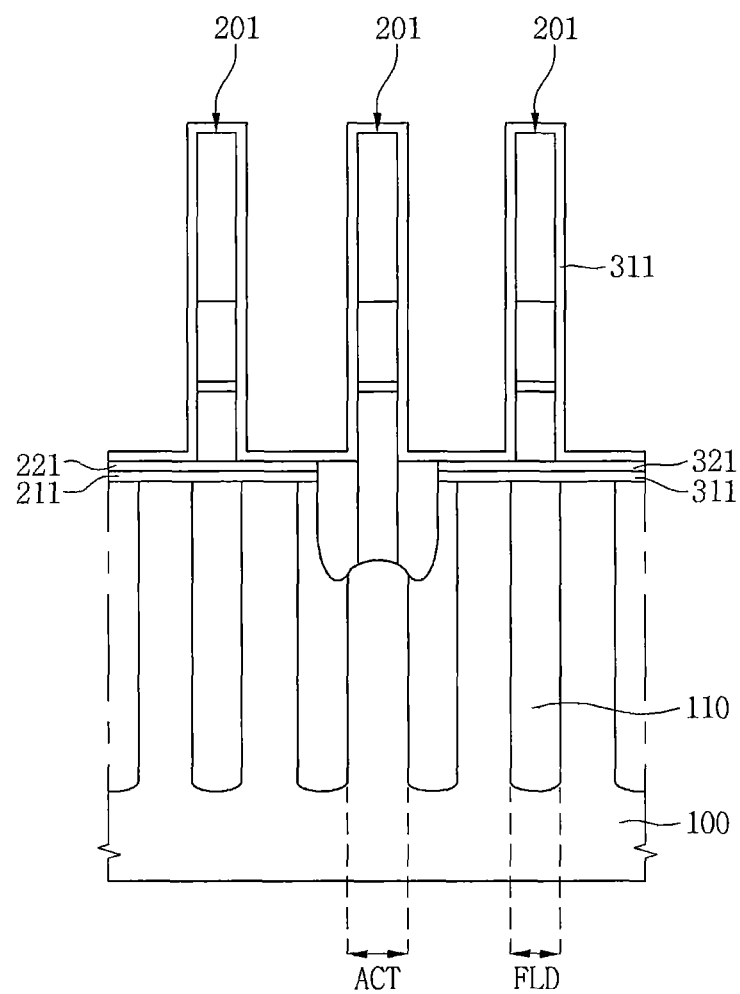
Figure 4C:
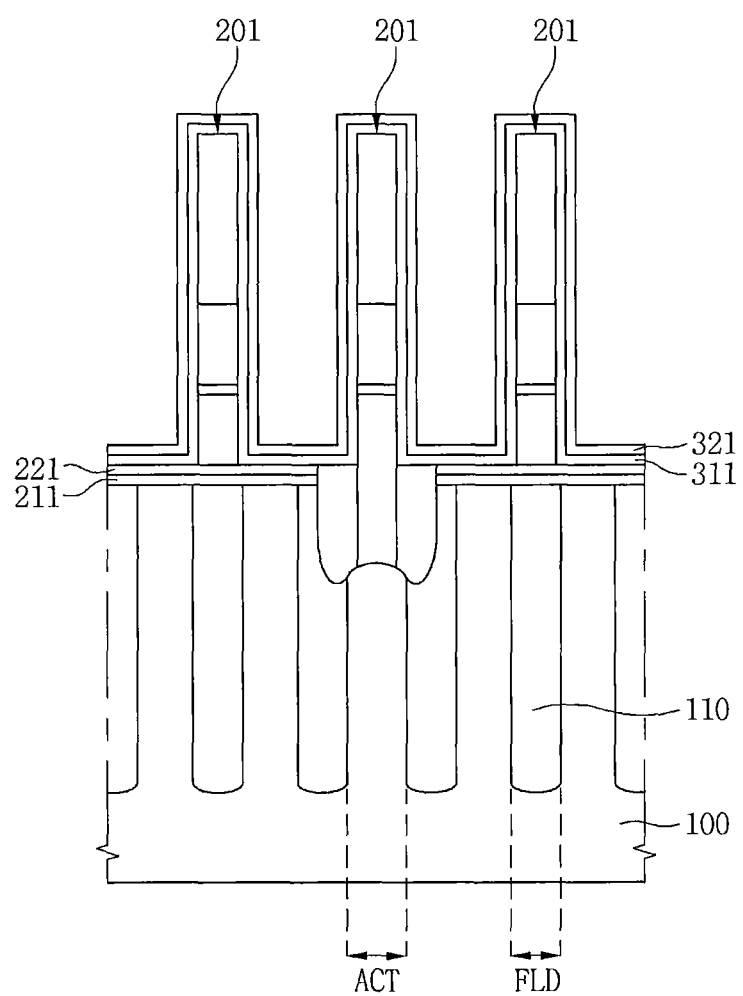
Figure 4D:
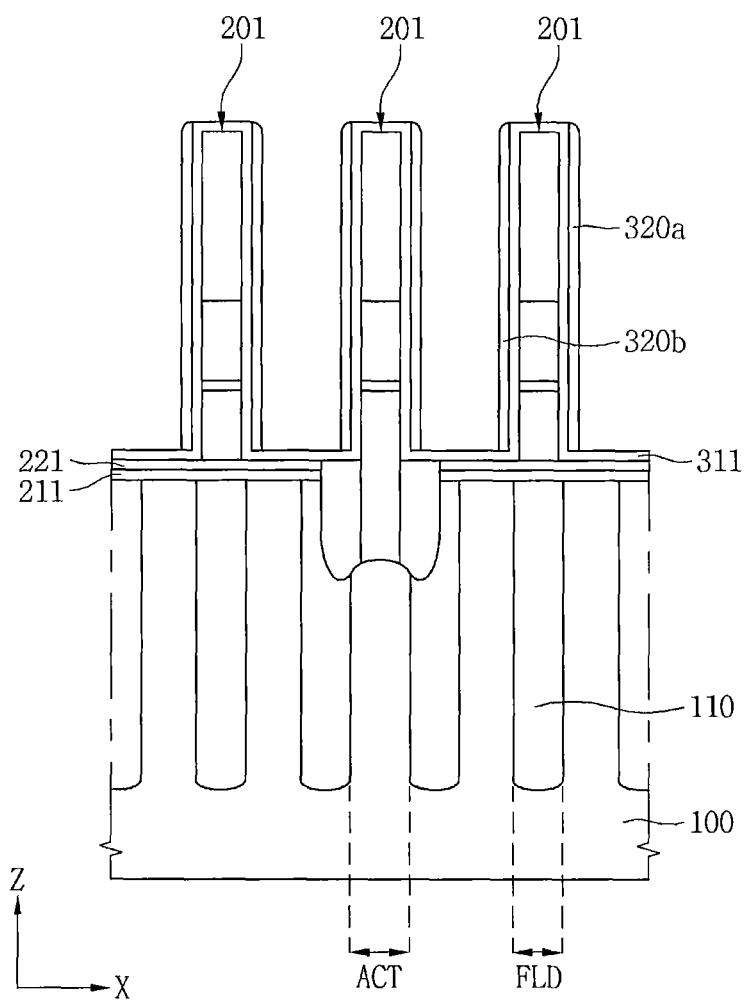
Figure 4E:
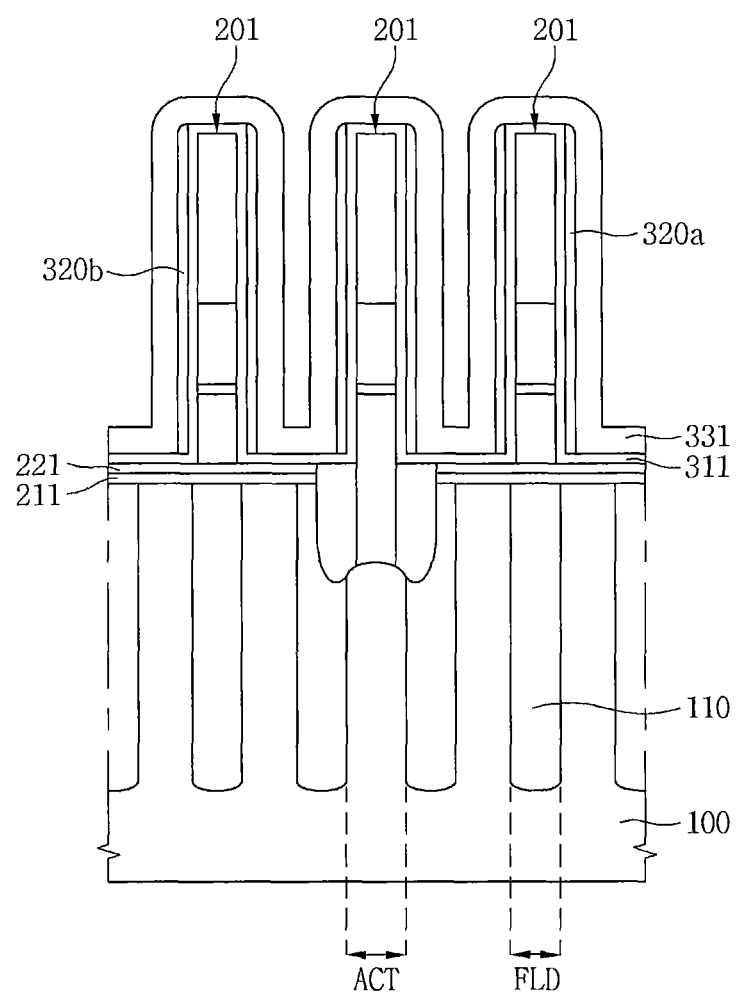
Figure 4F:
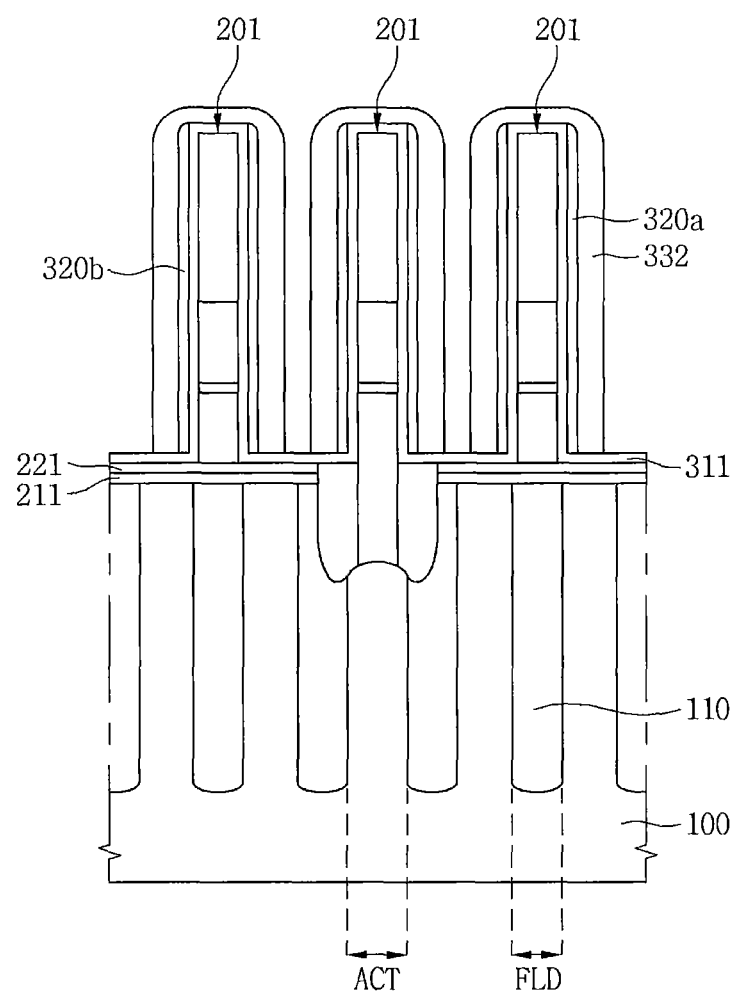
Figure 4G:
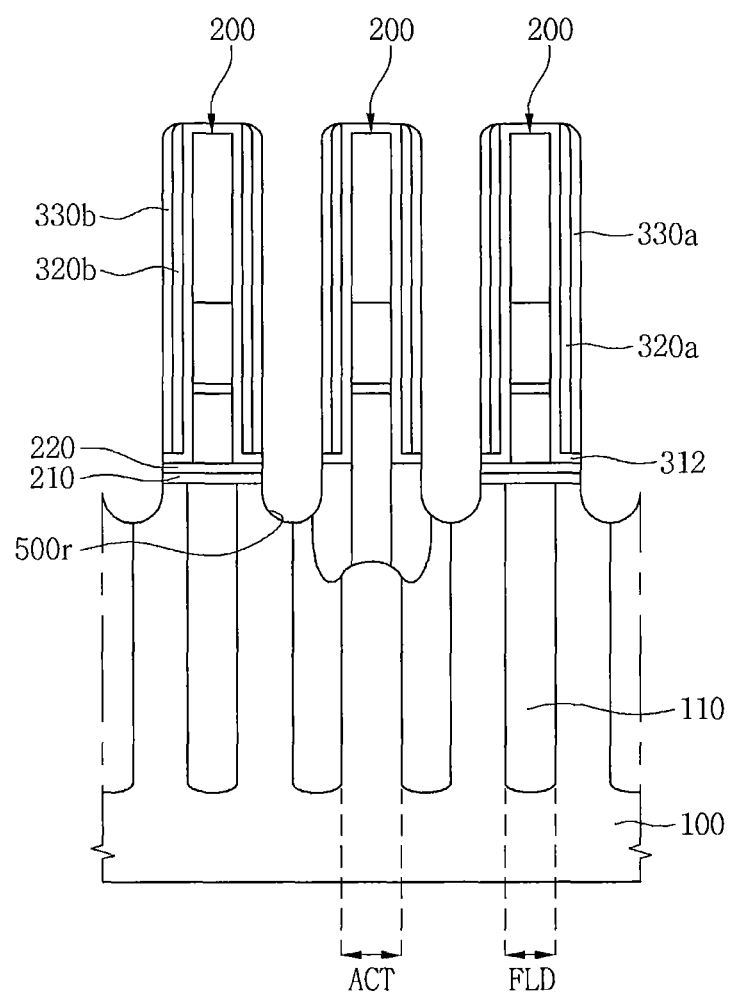
Figure 4H:
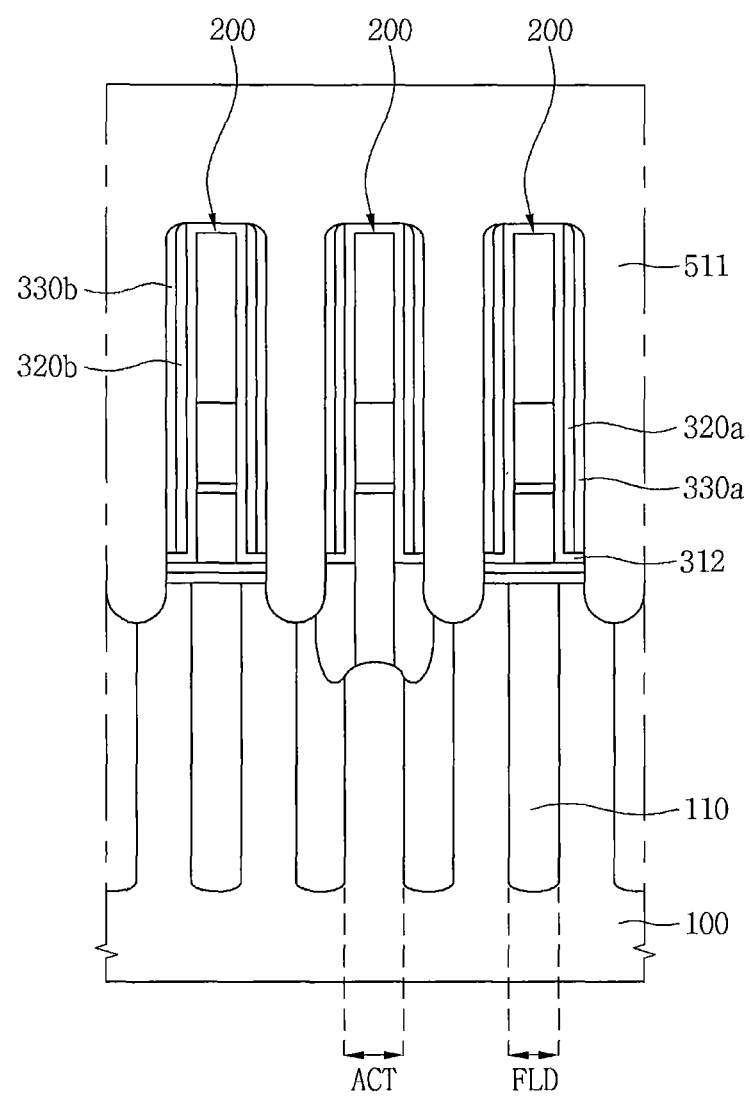
Figure 4I:
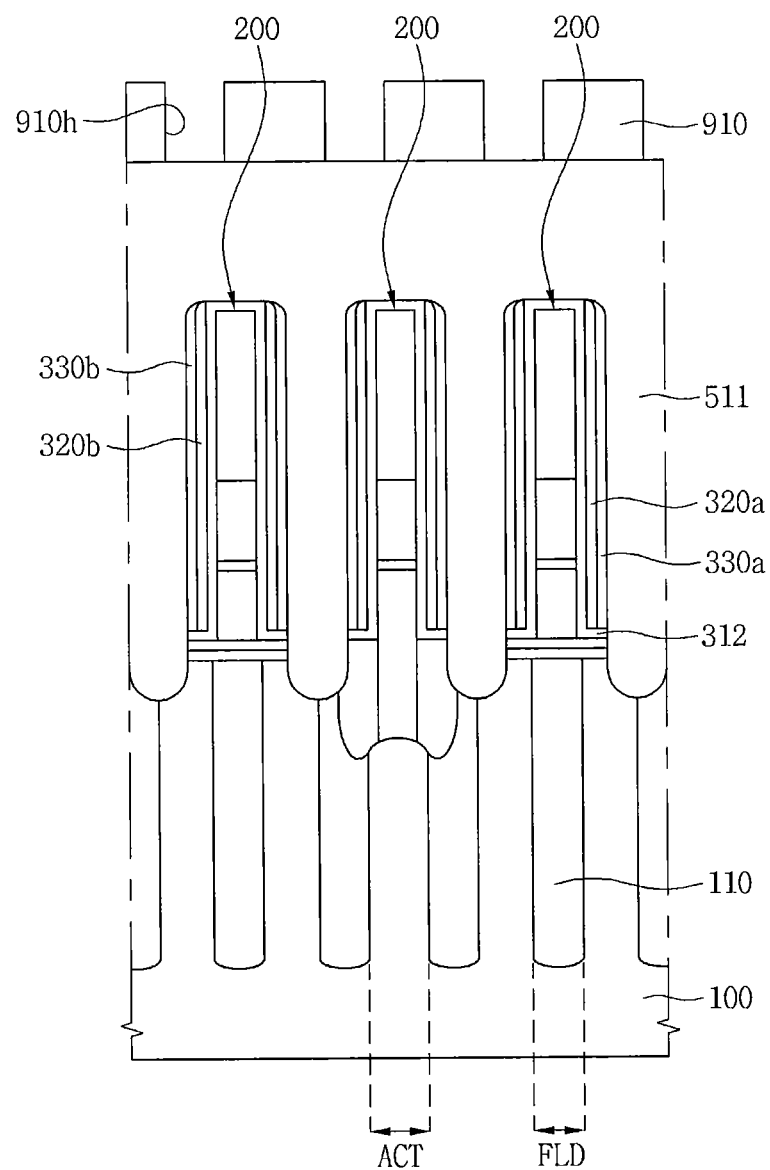
Figure 4J:
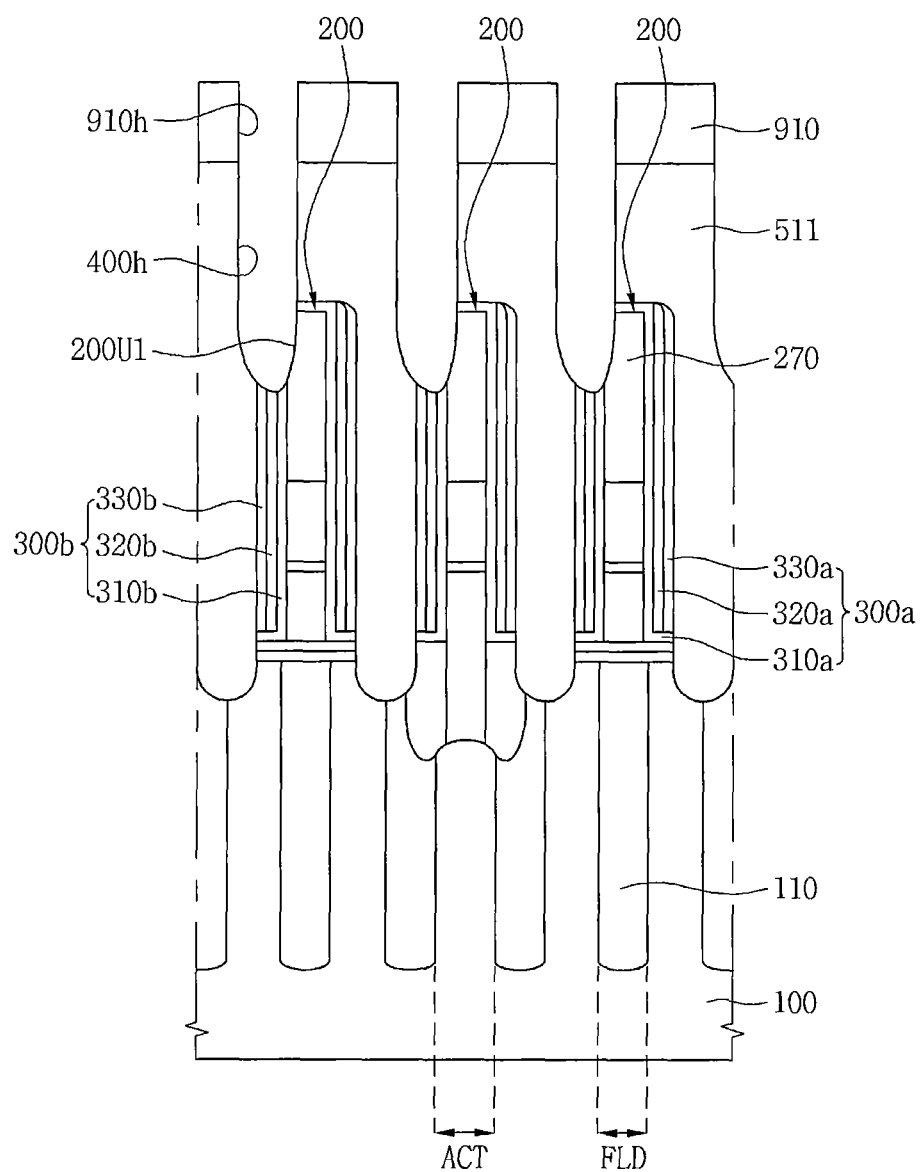
Figure 4K:
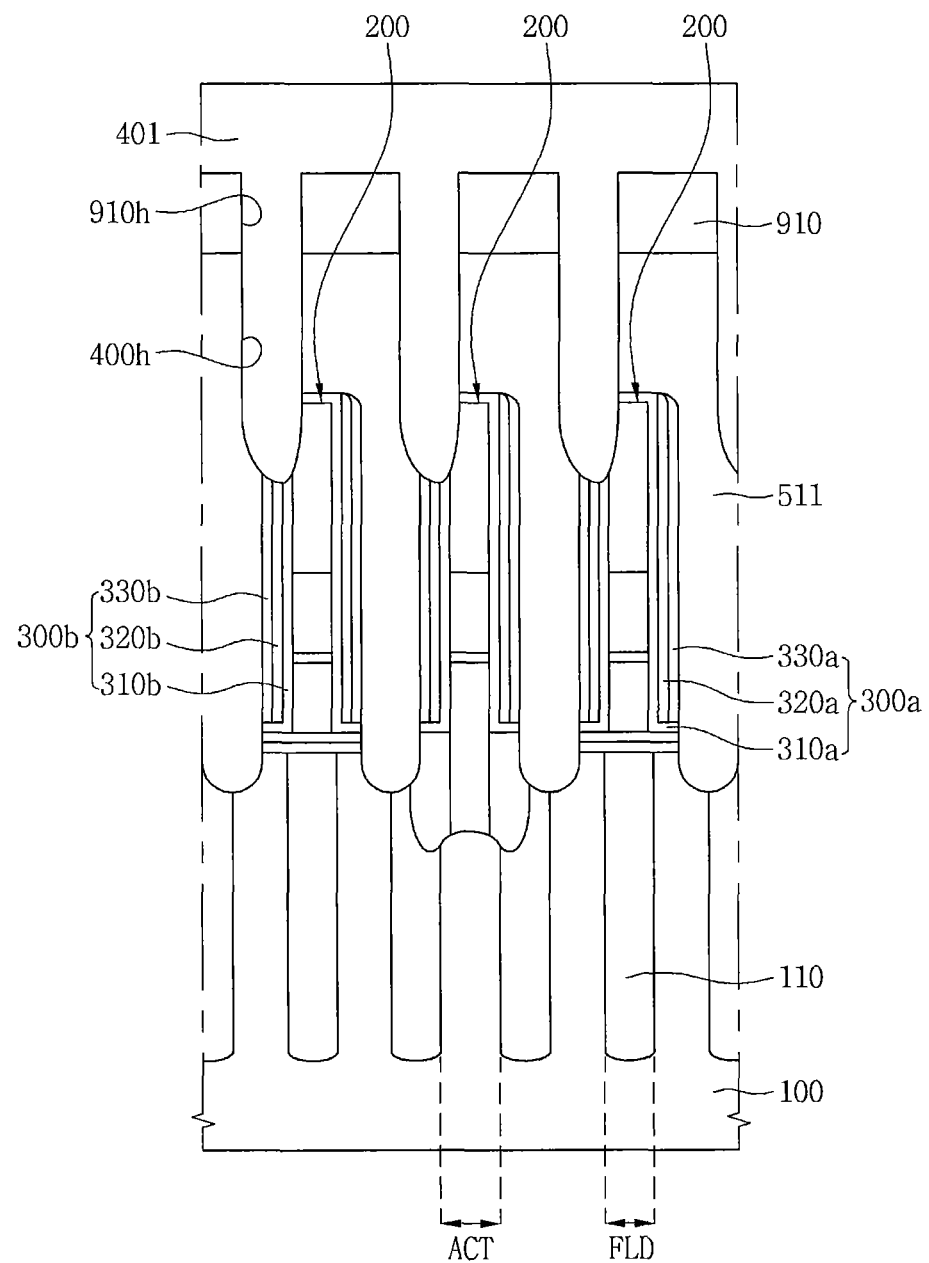
Figure 4L:
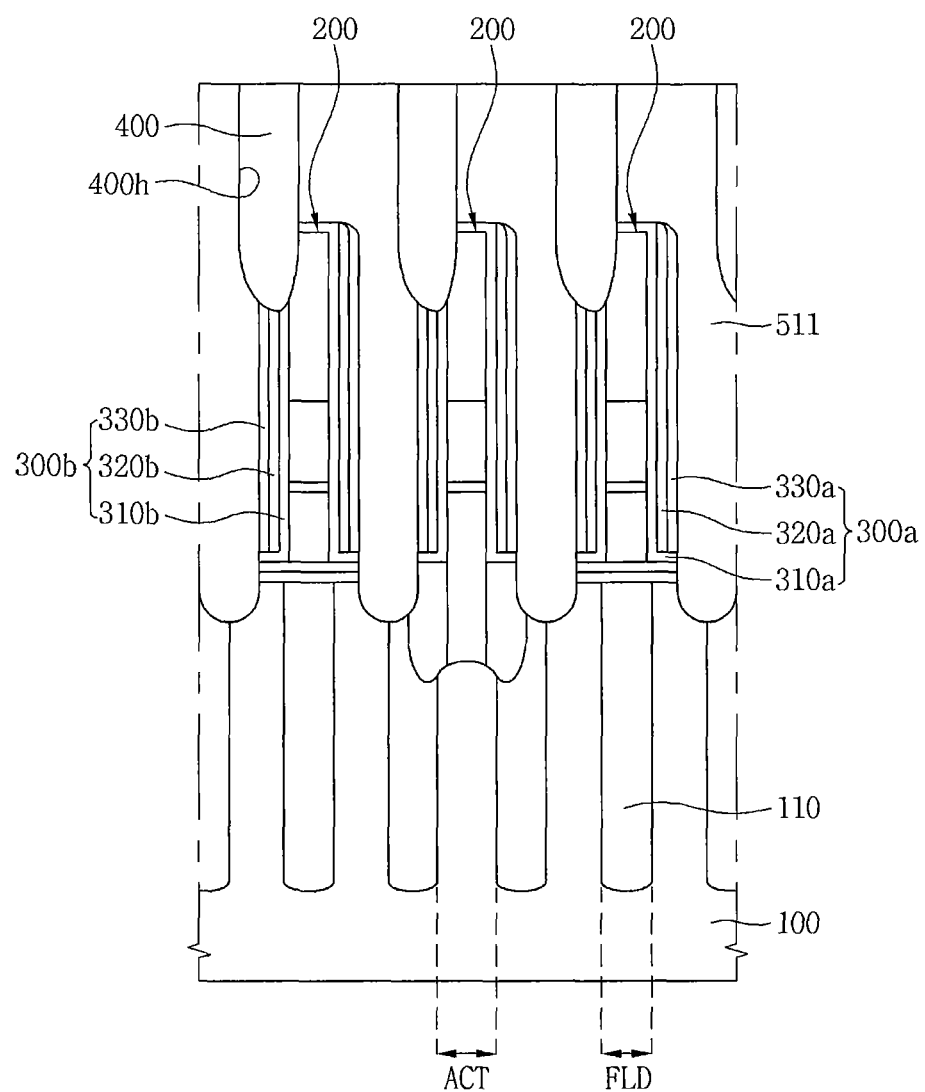
Figure 4M:
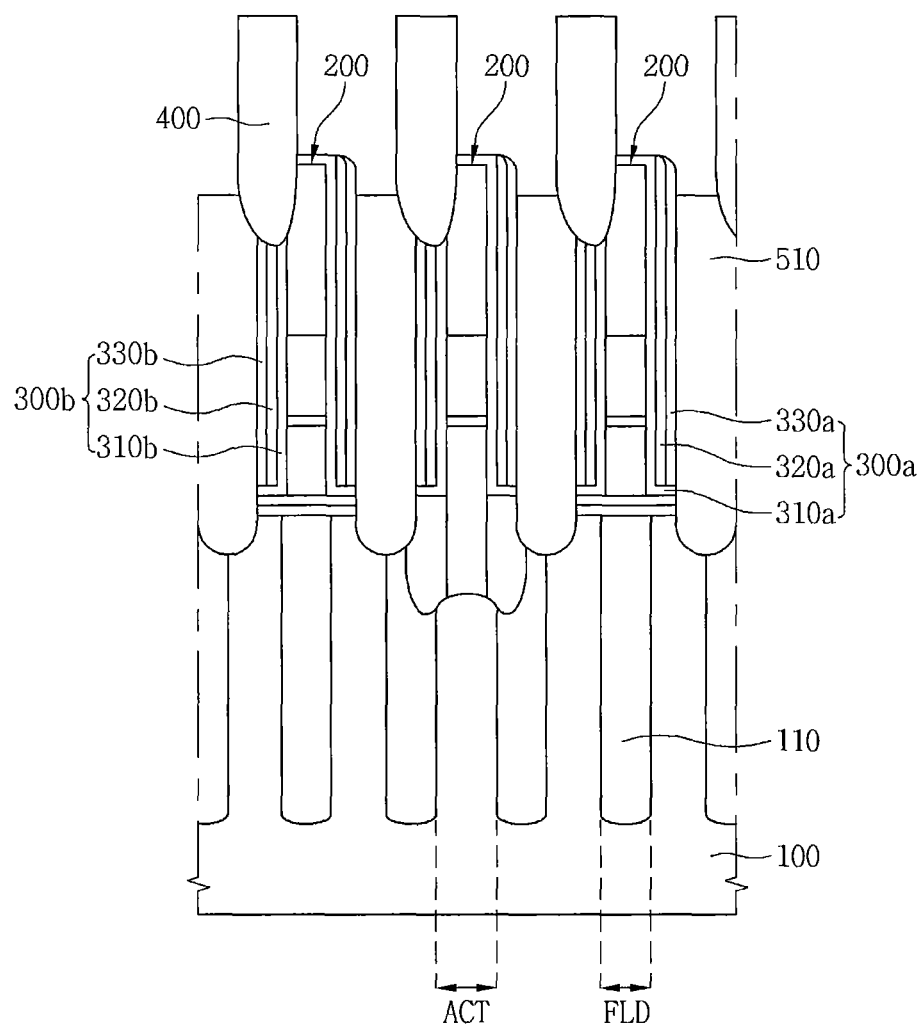
Figure 4N:
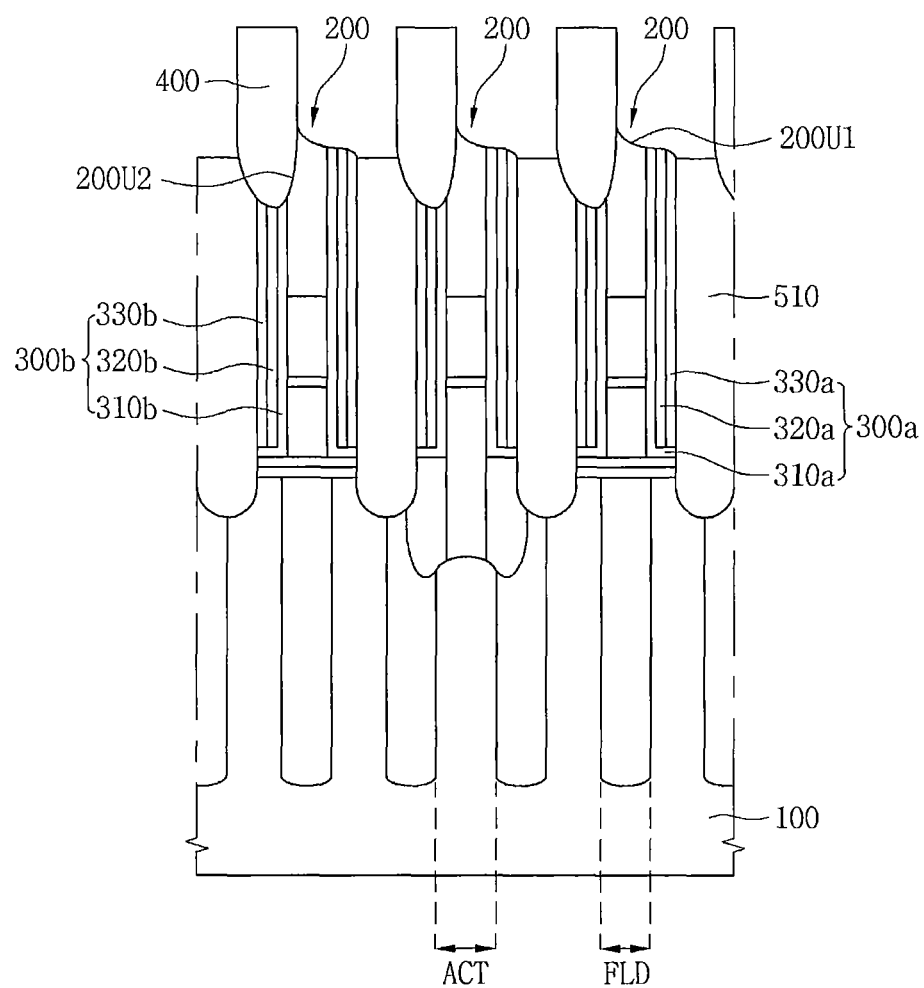
Figure 40:
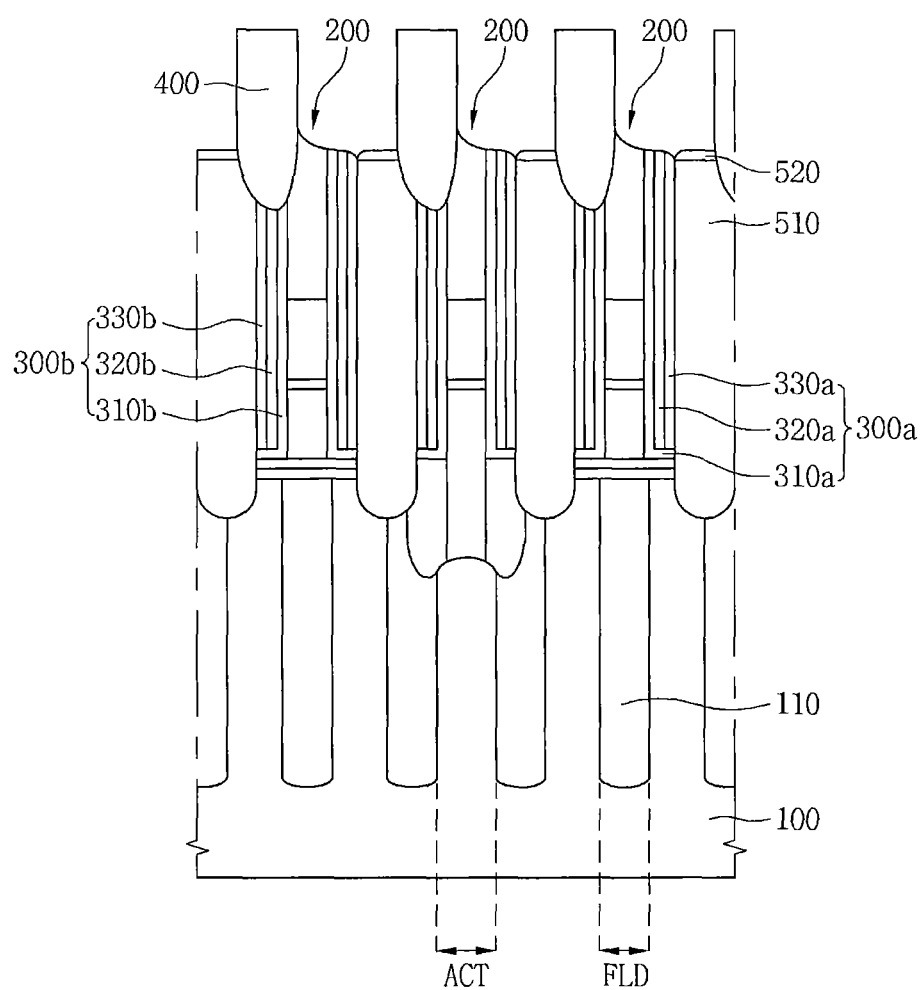
Figure 4P:
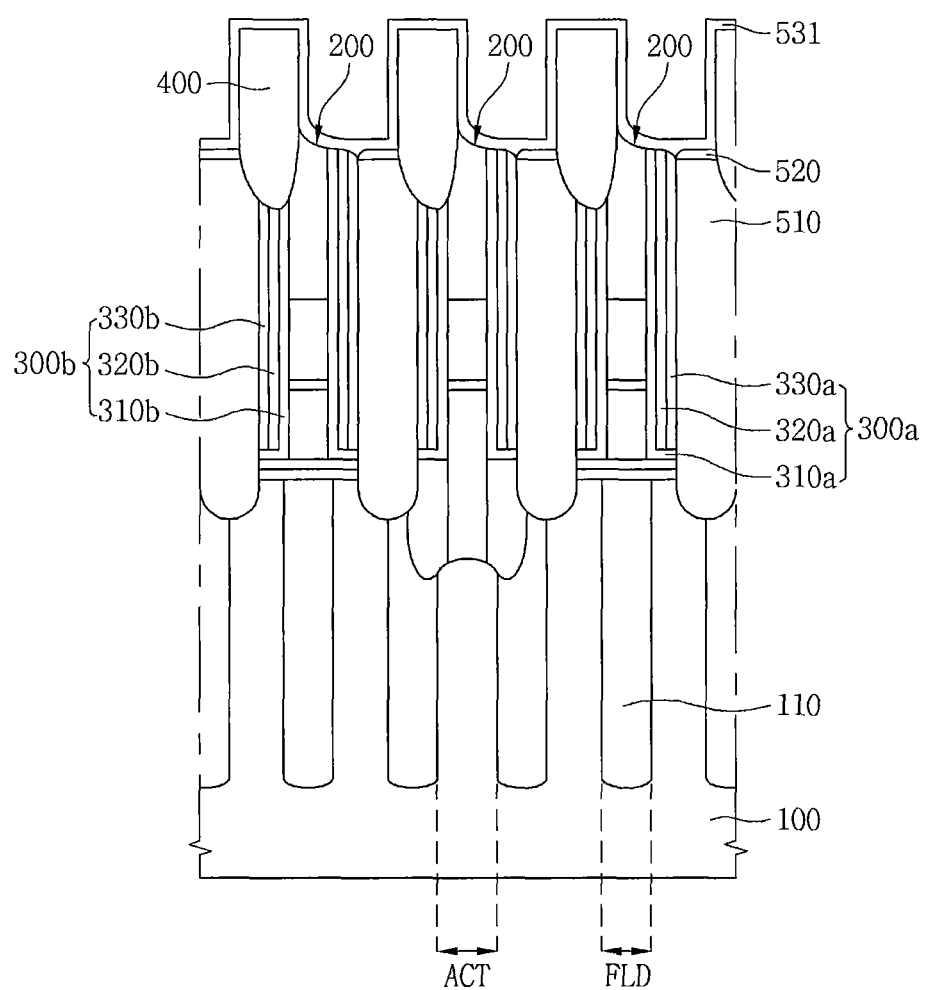
Figure 4Q:
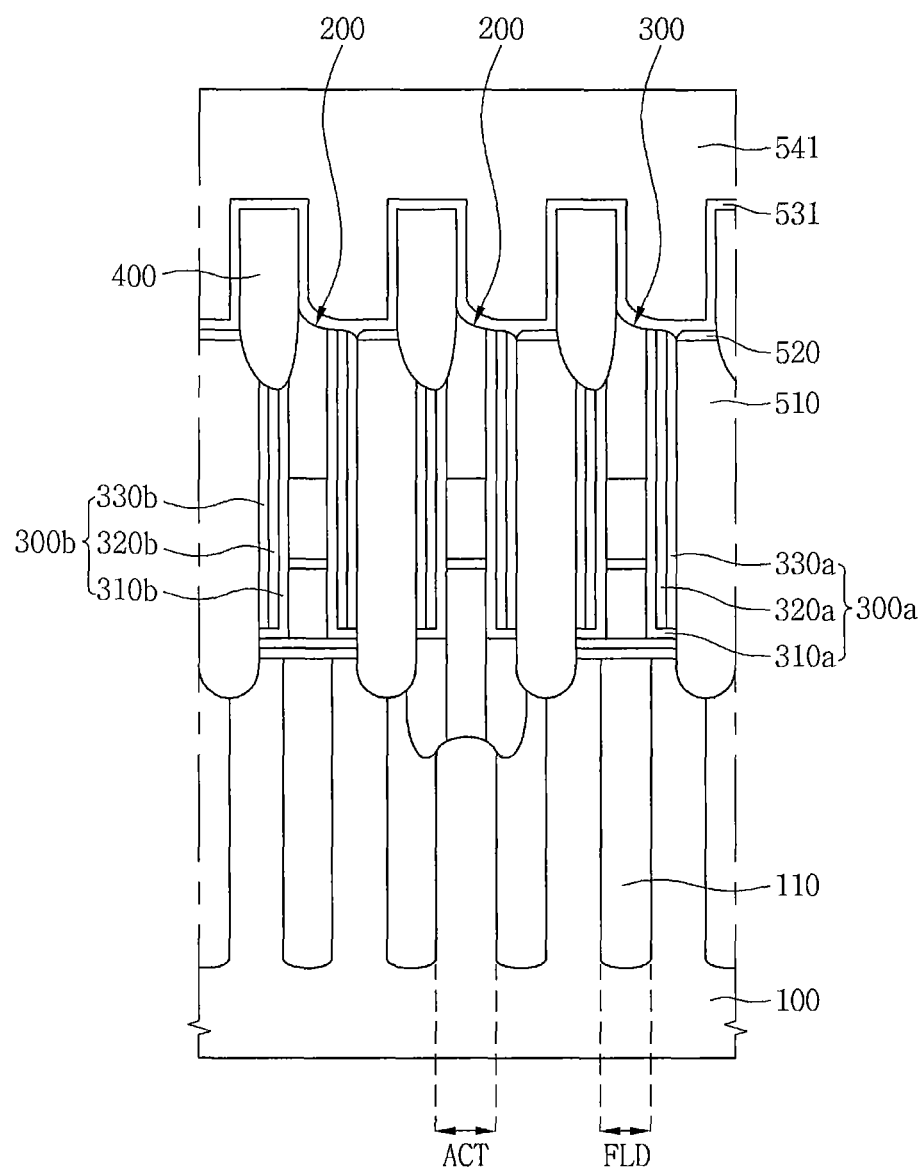

FIGS. 4A to 4Q are sequential sectional views illustrating a method of forming a semiconductor device sequentially according to some embodiments of present inventive concepts.

A method of forming a semiconductor device sequentially according to some embodiments of present inventive concepts is described with reference to FIGS. 1A, 1B, and 4A to 4Q. First, referring to FIG. 4A, the method of forming the semiconductor device sequentially according to some embodiments of present inventive concepts may include a process of preparing a semiconductor substrate 100 in which redundant bit line structures 201 are formed.

The process of preparing the semiconductor substrate 100 in which the redundant bit line structures 201 are formed may include a process of preparing the semiconductor substrate 100 including the active region ACT and the field region FLD, and a process of forming the redundant bit line structures 201 on the semiconductor substrate 100.

The process of preparing the semiconductor substrate 100 including the active region ACT and the field region FLD may include a process of forming a field trench 110*t* in the semiconductor substrate 100, and a process of filling the field trench 110*t* with a field insulator 110.

The process of forming the redundant bit line structures 201 may include a process of forming a lower bit line barrier film 211 on the semiconductor substrate 100, a process of forming an upper bit line barrier film 221 on the lower bit line barrier film 211, a process of forming a lower bit line electrode 230 on the upper bit line barrier film 221, a process of forming a bit line plug 240 between the lower bit line electrodes 230, a process of forming a middle bit line pattern 250 on the lower bit line electrode 230 and the bit line plug 240, a process of forming an upper bit line electrode 260 on the middle bit line pattern 250, and a process of forming a bit line capping pattern 270 on the upper bit line electrode 260.

The process of forming the bit line plug 240 may include a process of forming a plug contact hole 200*h* in the semiconductor substrate 100, a process of forming a plug conductive film of filling the plug contact hole 200*h*, a process of patterning the plug conductive film, and a process of filling the plug contact hole 200*h* with the plug insulating film 200*a*.

The process of forming the plug contact hole 200*h* may include a process of etching the lower bit line barrier film 211 and the upper bit line barrier film 221.

Referring to FIG. 4B, the method of forming the semiconductor device according to some embodiments of present inventive concepts may include a process of forming an inner spacer insulating film 311 on the redundant bit line structure 201. The process of forming the inner spacer insulating film 311 may include a process of depositing an insulating material on the semiconductor substrate 100 including the redundant bit line structure 201. For example, the process of forming the inner spacer insulating film 311 may include a process of depositing silicon nitride on the semiconductor substrate 100 including the redundant bit line structures 201.

Referring to FIG. 4C, the method of forming the semiconductor device according to some embodiments of present inventive concepts may include a process of forming a middle spacer insulating film 321 on the inner spacer insulating film 311. The process of forming the middle spacer insulating film 321 may include a process of depositing an insulating material on the inner spacer insulating film 311. The process of forming the middle spacer insulating film 321 may include a process of depositing an insulating material having an etching selectivity with respect to the inner spacer insulating film 311. For example, the process of forming the middle spacer insulating film 321 may include a process of depositing silicon oxide on the inner spacer insulating film 311.

Referring to FIG. 4D, the method of forming the semiconductor device according to some embodiments of present inventive concepts may include a process of forming a first middle bit line spacer 320*a* and a second middle bit line spacer 320*b* on the inner spacer insulating film 311. The process of forming the first middle bit line spacer 320*a* and the second middle bit line spacer 320*b* may include a process of removing a horizontal region of the middle spacer insulating film 321. For example, the process of forming the first middle bit line spacer 320*a* and the second middle bit line spacer 320*b* may include a process of etching the middle spacer insulating film 321 using a dry-etching process.

Referring to FIG. 4E, the method of forming the semiconductor device according to some embodiments of present inventive concepts may include a process of forming an outer spacer insulating film 331 on the first middle bit line spacer 320*a* and the second middle bit line spacer 320*b*. The process of forming the outer spacer insulating film 331 may include a process of depositing an insulating material on the semiconductor substrate 100 including the first middle bit line spacer 320*a* and the second middle bit line spacer 320*b*. The process of forming the outer spacer insulating film 331 may include a process of depositing an insulating material having an etching selectivity with respect to the first middle bit line spacer 320*a* and the second middle bit line spacer 320*b*. For example, the process of forming the outer spacer insulating film 331 may include a process of depositing silicon nitride on the semiconductor substrate 100 including the first middle bit line spacer 320*a* and the second middle bit line spacer 320*b*.

Referring to FIG. 4F, the method of forming the semiconductor device according to some embodiments of present inventive concepts may include a process of forming a redundant outer bit line spacer 332 on the first middle bit line spacer 320*a* and the second middle bit line spacer 320*b*. The process of forming the redundant outer bit line spacer 332 may include a process of removing a horizontal region of the outer spacer insulating film 331 disposed between the first middle bit line spacer 320*a* and the second middle bit line spacer 320*b*. For example, the process of forming the redundant outer bit line spacer 332 may include a process of etching the outer spacer insulating film 331 using a dry-etching process.

In the method of forming the semiconductor device according to some embodiments of present inventive concepts, the outer spacer insulating film 331 may remain on an upper surface of the redundant bit line structure 201 after the process of etching the outer spacer insulating film 331. Accordingly, in the method of forming the semiconductor device according to some embodiments of present inventive concepts, the redundant outer bit line spacers 332 may be formed to cover the redundant bit line structures 201.

Referring to FIG. 4G, the method of forming the semiconductor device according to some embodiments of present inventive concepts may include a process of forming recesses 500*r* in the semiconductor substrate 100. The process of forming the recesses 500*r* may include a process of forming redundant inner bit line spacers 312, a process of forming upper bit line barrier patterns 220, a process of forming lower bit line barrier patterns 210, and a process of recessing the semiconductor substrate 100.

The process of forming the redundant inner bit line spacers 312 may include a process of removing the inner spacer insulating film 311 exposed by the redundant outer bit line spacers 332. For example, the process of forming the redundant inner bit line spacers 312 may include a process of dry-etching the inner spacer insulating film 311 using the redundant outer bit line spacers 332 as an etch mask.

The process of forming the upper bit line barrier patterns 220 may include a process of removing the upper bit line barrier film 221 exposed by the redundant inner bit line spacers 312. For example, the process of forming the upper bit line barrier patterns 220 may include a process of dry-etching the upper bit line barrier film 221 using the redundant outer bit line spacers 332 and the redundant inner bit line spacers 312 as an etch mask.

The process of forming the lower bit line barrier patterns 210 may include a process of removing the lower bit line barrier film 211 exposed by the upper bit line barrier patterns 220. For example, the process of forming the lower bit line barrier patterns 210 may include a process of dry-etching the lower bit line barrier film 211 using the redundant outer bit line spacers 332, the redundant inner bit line spacers 312, and the upper bit line barrier patterns 220 as an etch mask.

In the method of forming the semiconductor device according to some embodiments of present inventive concepts, the bit line structures 200 may be formed by the process of forming the upper bit line barrier patterns 220, and the lower bit line barrier patterns 210.

Further, in the method of forming the semiconductor device according to some embodiments of present inventive concepts, the redundant outer bit line spacers 332 disposed on the upper surfaces of the bit line structures 200 may be removed by the process of forming the recesses 500r. Accordingly, in the method of forming the semiconductor device according to some embodiments of present inventive concepts, first outer bit line spacers 330a and second outer bit line spacers 330b may be formed by the process of forming the recesses 500r.

Referring to FIG. 4H, the method of forming the semiconductor device according to some embodiments of present inventive concepts may include a process of forming a lower plug conductive film 511 of filling the recesses 500r. The process of forming the lower plug conductive film 511 may include a process of depositing a conductive material on the semiconductor substrate 100 including the recesses 500r. The process of forming the lower plug conductive film 511 may include a process of filling a region between the first outer bit line spacers 330a and the second outer bit line spacers 330b with a conductive material. For example, the process of forming the lower plug conductive film 511 may include a process of forming polycrystalline silicon layer on the semiconductor substrate 100 including the recesses 500r.

Referring to FIG. 4I, the method of forming the semiconductor device according to some embodiments of present inventive concepts may include a process of forming a mask pattern 910 including openings 910h on the lower plug conductive film 511. The process of forming the mask pattern 910 may include a process of forming a mask layer on the lower plug conductive film 511, and a process of forming the openings 910h on the mask layer.

The process of forming the openings 910h may include a process of removing the mask layer disposed on the second middle bit line spacers 320b. The process of forming the openings 910h may include a process of removing the mask layer disposed on the second outer bit line spacers 330b. The process of forming the openings 910h may include a process of forming the openings 910h to expose upper surfaces disposed near the second middle bit line spacers 320b of the bit line structures 200.

Referring to FIG. 4J, the method of forming the semiconductor device according to some embodiments of present inventive concepts may include a process of forming isolating holes 400h in the lower plug conductive film 511. The process of forming the isolating holes 400h may include a process of removing the lower plug conductive film 511 exposed by the openings 910h, a process of etching the redundant inner bit line spacers 312 exposed by the openings 910h, a process of etching the bit line capping patterns 370 exposed by the openings 910h, a process of etching the second middle bit line spacers 320b, and a process of etching the second outer bit line spacers 330b.

In the method of forming the semiconductor device according to some embodiments of present inventive concepts, first inner bit line spacers 310a and second inner bit line spacers 310b may be formed by the process of etching the redundant inner bit line spacers 312.

In the method of forming the semiconductor device according to some embodiments of present inventive concepts, the first bit line spacers 300a may be formed by the formation of the first inner bit line spacers 310a. Further, in the method of forming the semiconductor device according to some embodiments of present inventive concepts, the second bit line spacers 300b may be formed by the formation of the second inner bit line spacers 310b.

In the method of forming the semiconductor device according to some embodiments of present inventive concepts, the second upper surfaces 200U2 of the bit line structures 200 may be formed by the process of etching the bit line capping patterns 370. In the method of forming the semiconductor device according to some embodiments of present inventive concepts, a level of the second upper surface 200U2 of each of the bit line structures 200 may be lower closer to the corresponding second bit line spacer 300b.

In the method of forming the semiconductor device according to some embodiments of present inventive concepts, the second bit line spacers 300b and the second upper surfaces 200U2 of the bit line structures 200 may be simultaneously recessed. In the method of forming the semiconductor device according to some embodiments of present inventive concepts, the upper surface of each of the second inner bit line spacers 310b may be connected (e.g., to form a continuous surface) with the second upper surface 200U2 of a corresponding bit line structure 200.

Referring to FIG. 4K, the method of forming the semiconductor device according to some embodiments of present inventive concepts may include a process of forming a molding film 401 filling the isolating holes 400h. The process of forming the molding film 401 may include a process of depositing an insulating material on the semiconductor substrate 100 including the isolating holes 400h. For example, the process of forming the molding film 401 may include a process of filling the isolating holes 400h with silicon nitride.

Referring to FIG. 4L, the method of forming the semiconductor device according to some embodiments of present inventive concepts may include a process of forming interlayer insulating films 400 in the isolating holes 400h. The process of forming the interlayer insulating films 400 may include a process of removing the mask pattern 910, and a process of planarizing the molding film 401 to expose the lower plug conductive film 511.

The process of removing the mask pattern 910 may be performed in the same chamber as the process of planarizing the molding film 401. For example, the process of forming the interlayer insulating films 400 may include a process of planarizing the molding film 401 and the mask pattern 910.

The process of planarizing the molding film 401 and the mask pattern 910 may include a chemical mechanical polishing (CMP) process.

Referring to FIG. 4M, the method of forming the semiconductor device according to some embodiments of present inventive concepts may include a process of forming a lower plug pad 510 between the bit line structures 200. The process of forming the lower plug pad 510 may include a process of etching back the lower plug conductive film 511. The process of forming the lower plug pad 510 may include a process of etching back the lower plug conductive film 511 such that a level of an upper surface of the lower plug pad 510 is lower than a level of an upper surface of the bit line structure 200.

In the method of forming the semiconductor device according to some embodiments of present inventive concepts, the level of the upper surface of the lower plug pad 510 may be higher than the lowest level of the interlayer insulating film 400.

Referring to FIG. 4N, the method of forming the semiconductor device according to some embodiments of present inventive concepts may include a process of recessing upper end portions of the bit line structures 200 and upper end portions of the first bit line spacers 300a. In the method of forming the semiconductor device according to some embodiments of present inventive concepts, the first upper surfaces 200U1 of the bit line structures 200 may be formed by the process of recessing the upper end portions of the bit line structures 200. In the method of forming the semiconductor device according to some embodiments of present inventive concepts, a level of the first upper surface 200U1 of each of the bit line structures 200 may be lower closer to the corresponding first bit line spacer 300a.

In the method of forming the semiconductor device according to some embodiments of present inventive concepts, the first bit line spacers 300a and the first upper surfaces 200U1 of the bit line structures 200 may be simultaneously recessed. In the method of forming the semiconductor device according to some embodiments of present inventive concepts, the upper surface of each of the first bit line spacers 300a may be connected (e.g., to form a continuous surface) with the first upper surface 200U1 of a corresponding bit line structure 200.

Referring to FIG. 4O, the method of forming the semiconductor device according to some embodiments of present inventive concepts may include a process of forming a middle plug pad 520 on the lower plug pad 510. The process of forming the middle plug pad 520 may include a process of forming a metal silicide layer on the upper surface of the lower plug pad 510.

Referring to FIG. 4P, the method of forming the semiconductor device according to some embodiments of present inventive concepts may include a process of forming a plug barrier film 531 on the middle plug pads 520 and the interlayer insulating films 400. The process of forming the plug barrier film 531 may include a process of forming metal oxide or metal nitride on the semiconductor substrate 100 including the middle plug pads 520 and the interlayer insulating films 400.

Referring to FIG. 4Q, the method of forming the semiconductor device according to some embodiments of present inventive concepts may include a process of forming an upper plug conductive film 541 on the plug barrier film 531. The process of forming the upper plug conductive film 541 may include a process of filling vertical regions of the plug barrier film 531 with a conductive material. The process of forming the upper plug conductive film 541 may include a process of filling a space between the interlayer insulating films 400 with a conductive material. For example, the process of forming the upper plug conductive film 541 may include a process of depositing a metal on the semiconductor substrate 100 including the plug barrier film 531.

Referring to FIGS. 1A and 1B, the method of forming the semiconductor device according to some embodiments of present inventive concepts may include a process of forming plug barrier patterns 530 and upper plug pads 540 on the semiconductor substrate 100. The process of forming the plug barrier patterns 530 and the upper plug pads 540 may include a process of planarizing the plug barrier film 531 and the upper plug conductive film 541 to expose the upper surfaces of the interlayer insulating films 400. For example, the process of planarizing the plug barrier film 531 and the upper plug conductive film 541 may include a CMP process.

In the method of forming the semiconductor device according to some embodiments of present inventive concepts, storage contact plugs 500 may be formed by the process of forming the plug barrier patterns 530 and the upper plug pads 540. Moreover, in the method of forming the semiconductor device according to some embodiments of present inventive concepts, the storage contact plugs 500 may be extended along the first upper surfaces 200U1 of the bit line structures 200. Accordingly, in the method of forming the semiconductor device according to some embodiments of present inventive concepts, reliability of the storage contact plugs 500 can be improved.

Figure 5A:
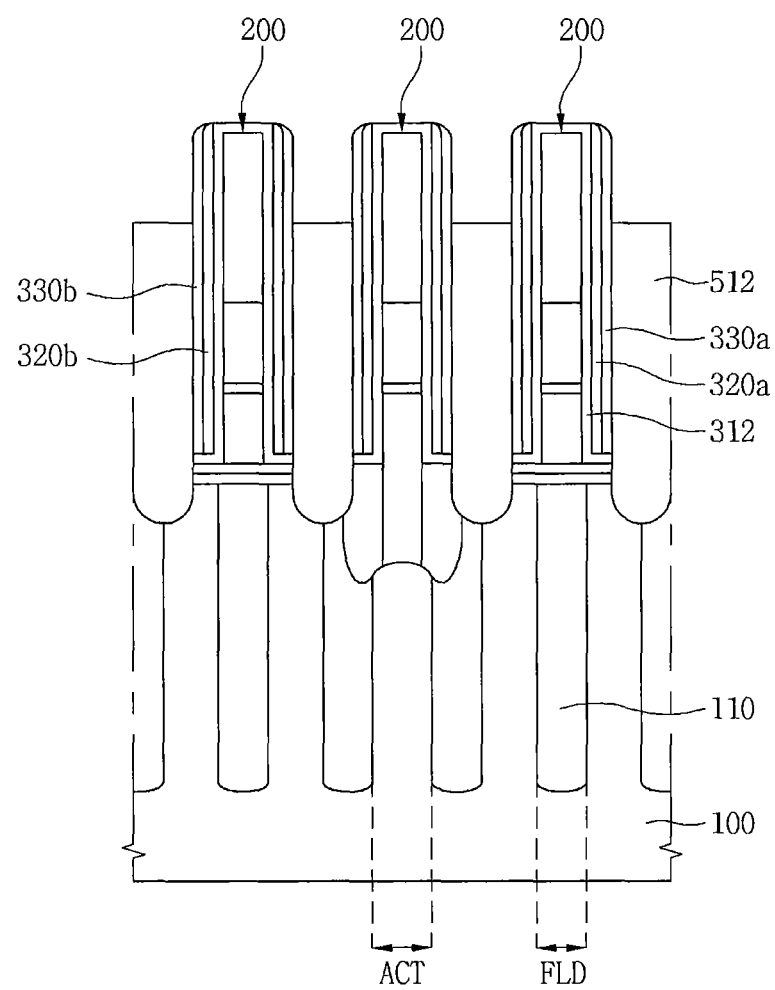
FIGS. 5A to 5M are sequential sectional views illustrating a method of forming a semiconductor device sequentially according to some embodiments of present inventive concepts.

FIGS. 5A to 5M are sequential sectional views illustrating a method of forming a semiconductor device sequentially according to some embodiments of present inventive concepts. A method of forming a semiconductor device according to some embodiments of present inventive concepts is described with reference to FIGS. 2A, 2B, and 5A to 5M. First, referring to FIG. 5A, the method of forming the semiconductor device according to some embodiments of present inventive concepts may include a process of preparing a semiconductor substrate 100 including an active region ACT and a field region FLD, a process of forming bit line structures 200 on the semiconductor substrate 100, a process of forming redundant inner bit line spacers 312 on the bit line structures 200, a process of forming first middle bit line spacers 320a and second middle bit line spacers 320b on the redundant inner bit line spacers 312, a process of forming first outer bit line spacers 330a on the first middle bit line spacers 320a, a process of forming second outer bit line spacers 330b on the second middle bit line spacers 320b, and a process of forming lower plug conductive patterns 512 between the first outer bit line spacers 330a and the second outer bit line spacers 330b.

The process of forming the lower plug conductive patterns 512 may include a process of forming a lower plug conductive film filling regions between the first outer bit line spacers 330a and the second outer bit line spacers 330b, and a process of etching back the lower plug conductive film such that a level of upper surfaces of the lower plug conductive patterns 512 is lower than the highest level of the bit line structures 200.

Figure 5B:
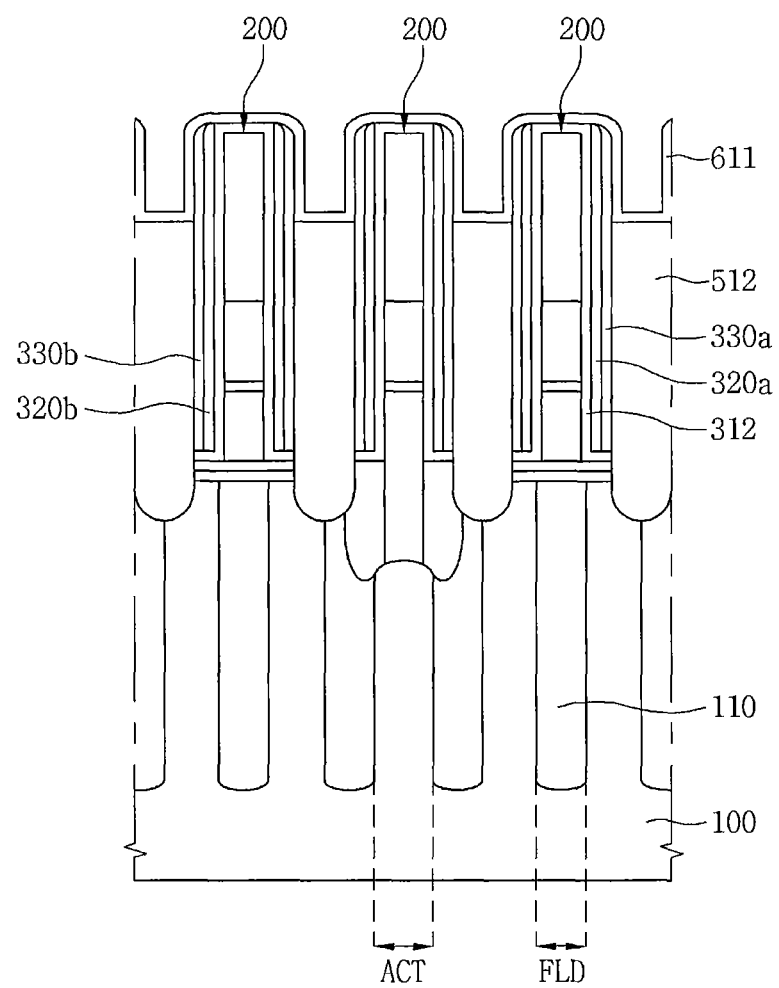

Referring to FIG. 5B, the method of forming the semiconductor device according to some embodiments of present inventive concepts may include a process of forming a first separation spacer insulating film 611 on the first outer bit line spacers 330a, the second outer bit line spacers 330b, and the lower plug conductive patterns 512. The process of forming the first separation spacer insulating film 611 may include a process of depositing an insulating material on the semiconductor substrate 100 including the lower plug conductive patterns 512. For example, the process of forming the first separation spacer insulating film 611 may include a process of depositing silicon nitride on the semiconductor substrate 100 including the lower plug conductive patterns 512.

Figure 5C:
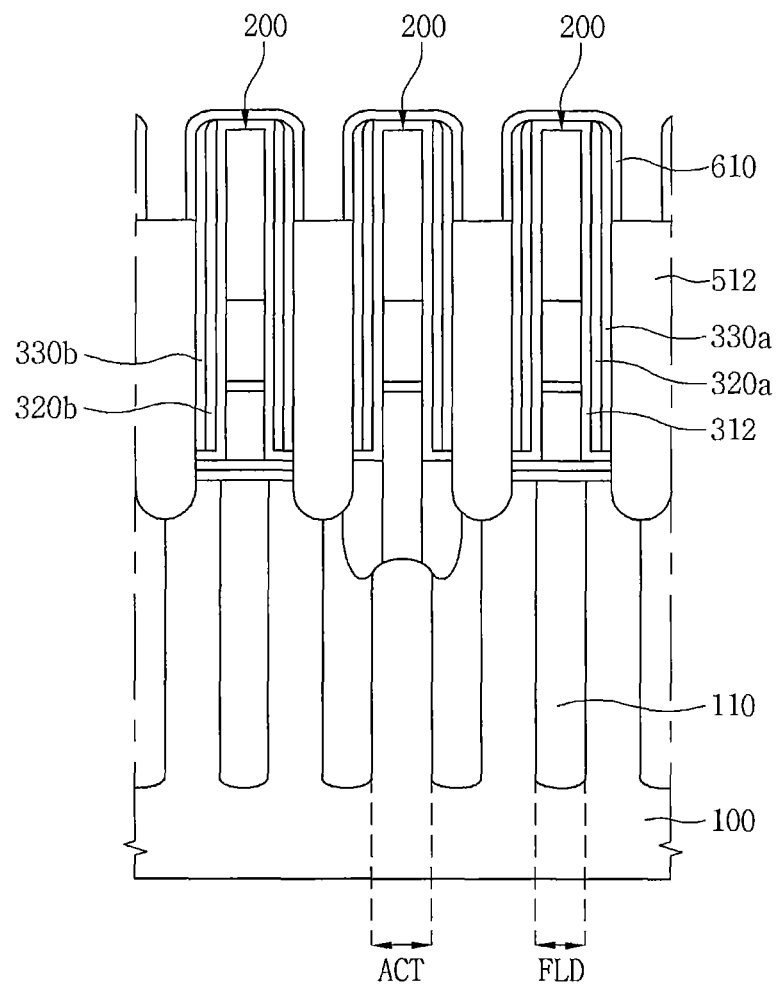

Referring to FIG. 5C, the method of forming the semiconductor device according to some embodiments of present inventive concepts may include a process of forming first plug separation spacers 610 on the first outer bit line spacers 330a and the second outer bit line spacers 330b. The process of forming the first plug separation spacers 610 may include a process of removing a horizontal region of the first separation spacer insulating film 611 disposed on the lower plug conductive patterns 512. For example, the process of forming the first plug separation spacers 610 may include a process of etching the first separation spacer insulating film 611 using a dry-etching process.

In the method of forming the semiconductor device according to some embodiments of present inventive concepts, the first separation spacer insulating film 611 may remain on the upper surfaces of the bit line structures 200 by the process of etching the first separation spacer insulating film 611. Accordingly, in the method of forming the semiconductor device according to some embodiments of present inventive concepts, the first plug separation spacers 610 may cover the bit line structures 200.

Figure 5D:
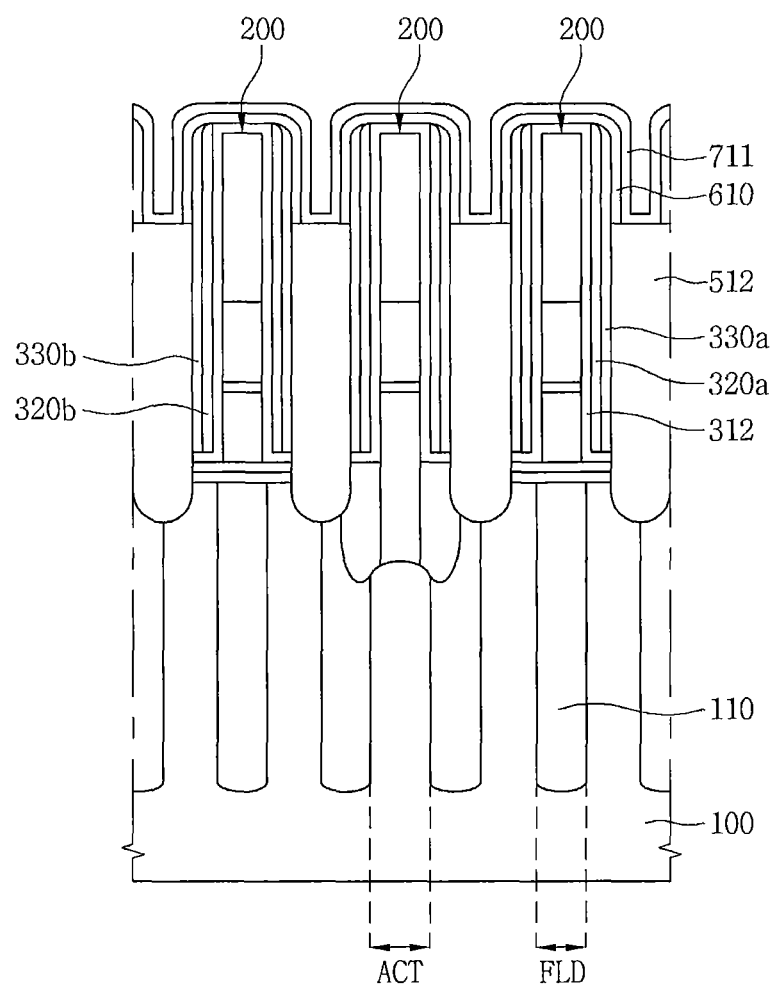

Referring to FIG. 5D, the method of forming the semiconductor device according to some embodiments of present inventive concepts may include a process of forming a second separation spacer insulating film 711 on the first plug separation spacers 610. The process of forming the second separation spacer insulating film 711 may include a process of depositing an insulating material on the semiconductor substrate 100 including the first plug separation spacers 610. The process of forming the second separation spacer insulating film 711 may include a process of depositing an insulating material having an etching selectivity with respect to the first plug separation spacers 610. For example, the process of forming the second separation spacer insulating film 711 may include a process of depositing silicon oxide on the semiconductor substrate 100 including the first plug separation spacers 610.

Figure 5E:
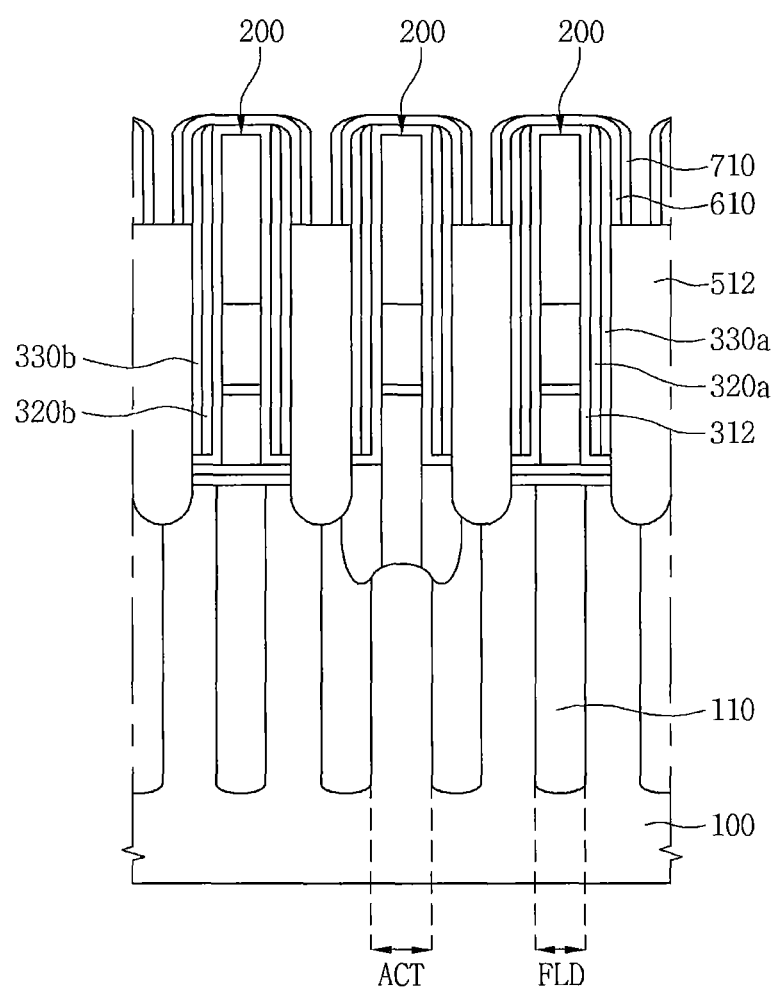

Referring to FIG. 5E, the method of forming the semiconductor device according to some embodiments of present inventive concepts may include a process of forming second plug separation spacers 710 on the first plug separation spacers 610. The process of forming the second plug separation spacers 710 may include a process of removing a horizontal region of the second separation spacer insulating film 711. For example, the process of forming the second plug separation spacers 710 may include a process of etching the second separation spacer insulating film 711 using a thy-etching process.

Figure 5F:
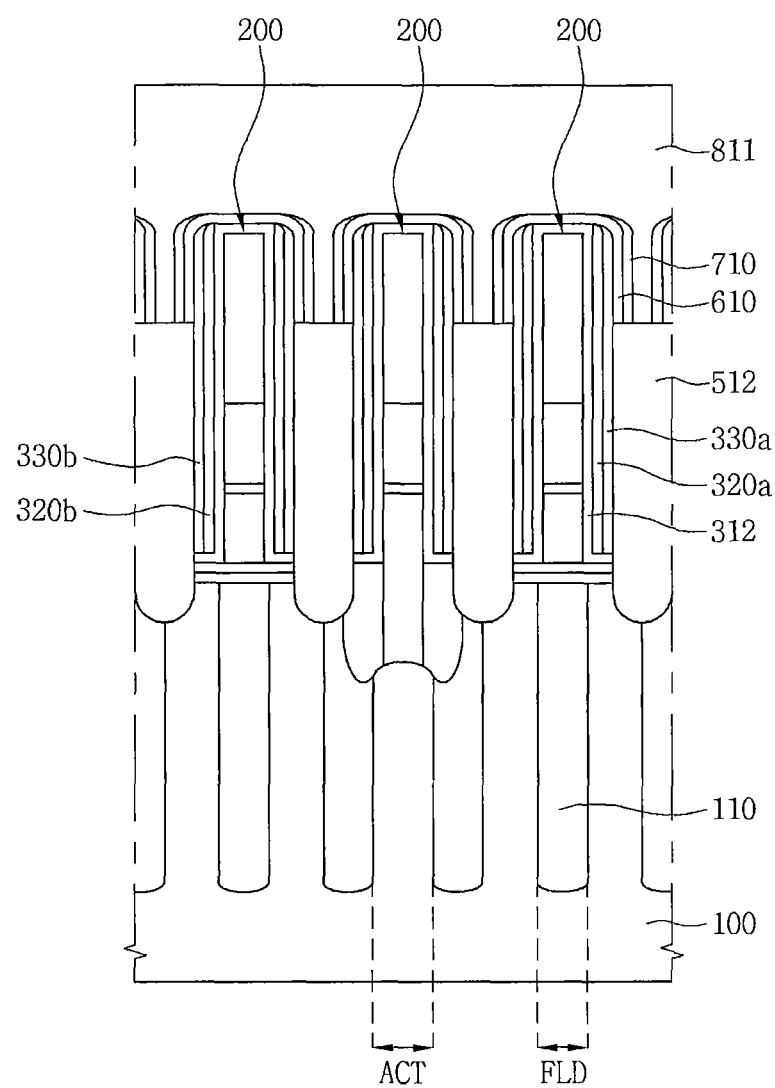

Referring to FIG. 5F, the method of forming the semiconductor device according to some embodiments of present inventive concepts may include a process of forming a molding film 811 on the second plug separation spacers 710. The process of forming the molding film 811 may include a process of depositing an insulating material on the semiconductor substrate 100 including the second plug separation spacers 710. The process of forming the molding film 811 may include a process of filling a space between the second plug separation spacers 710 with an insulating material. For example, the process of forming the molding film 811 may include a process of forming a spin on hardmask (SOH) film on the semiconductor substrate 100 including the second plug separation spacers 710.

Figure 5G:
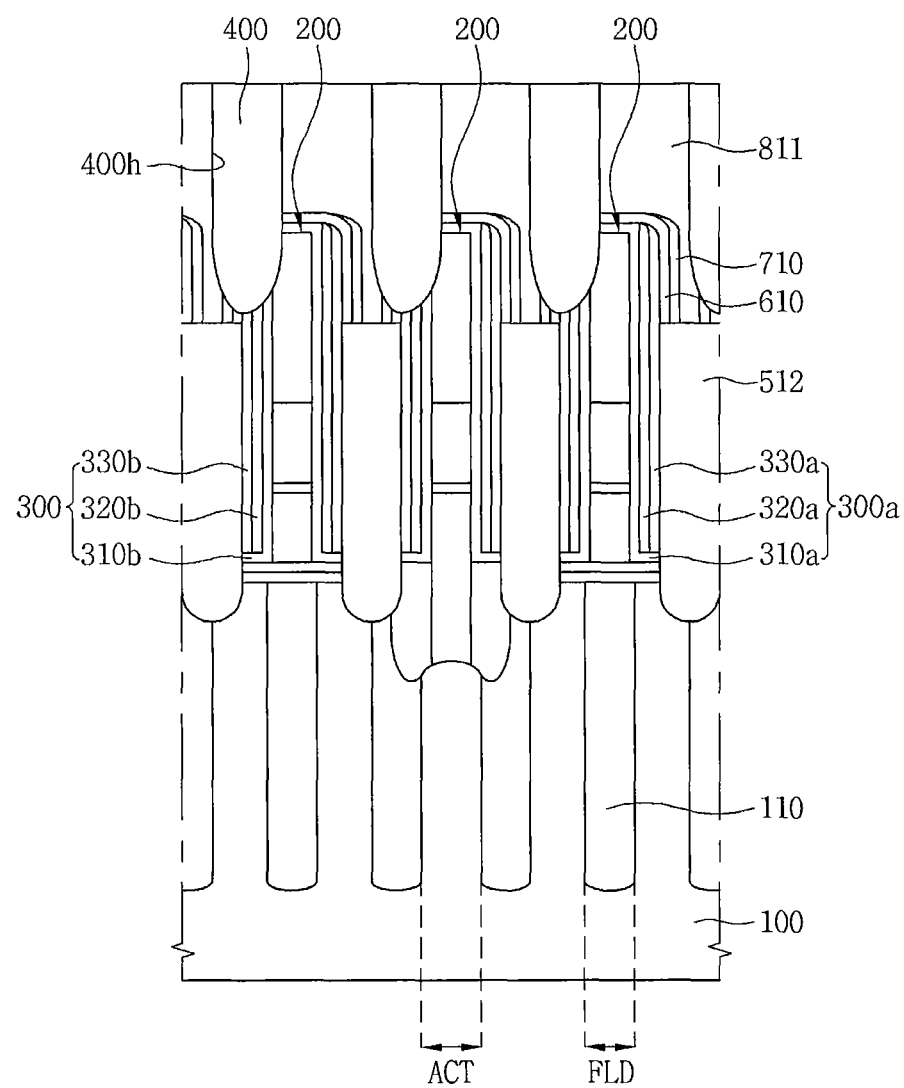

Referring to FIG. 5G, the method of forming the semiconductor device according to some embodiments of present inventive concepts may include a process of forming interlayer insulating films 400 in the molding film 811. The process of forming the interlayer insulating films 400 may include a process of forming isolating holes 400h in the molding film 811, and a process of forming the interlayer insulating films 400 in the isolating holes 400h. In the method of forming the semiconductor device according to some embodiments of present inventive concepts, the first plug separation spacer 610 and the second plug separation spacer 710 disposed on the second outer bit line spacers 330b may be recessed.

Figure 5H:
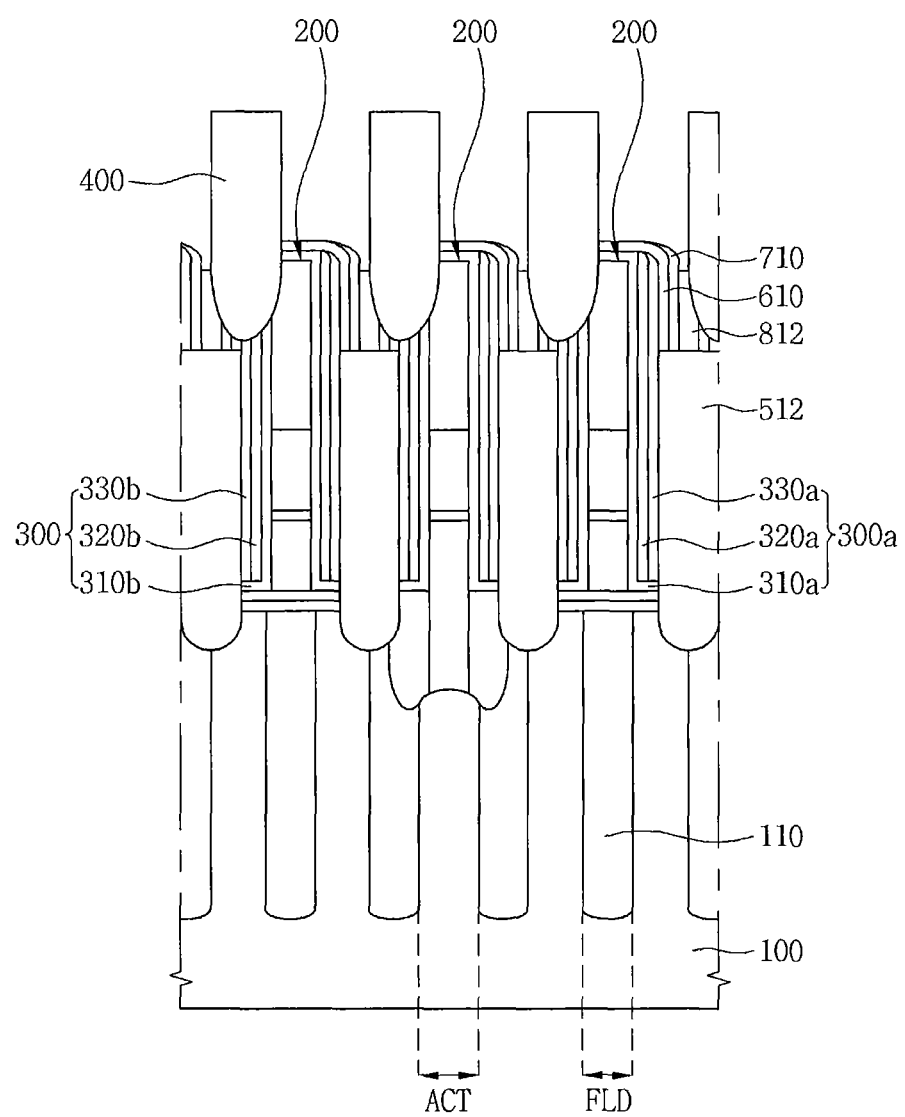

Referring to FIG. 5H, the method of forming the semiconductor device according to some embodiments of present inventive concepts may include a process of forming molding patterns 812 between the second plug separation spacers 710 and the interlayer insulating films 400. The process of forming the molding patterns 812 may include a process of etching back the molding film 811. For example, the process of forming the molding patterns 812 may include a process of etching back the molding film 811 such that a level of upper surfaces of the molding patterns 812 is lower than the highest level of each of the second plug separation spacers 710.

Figure 5I:
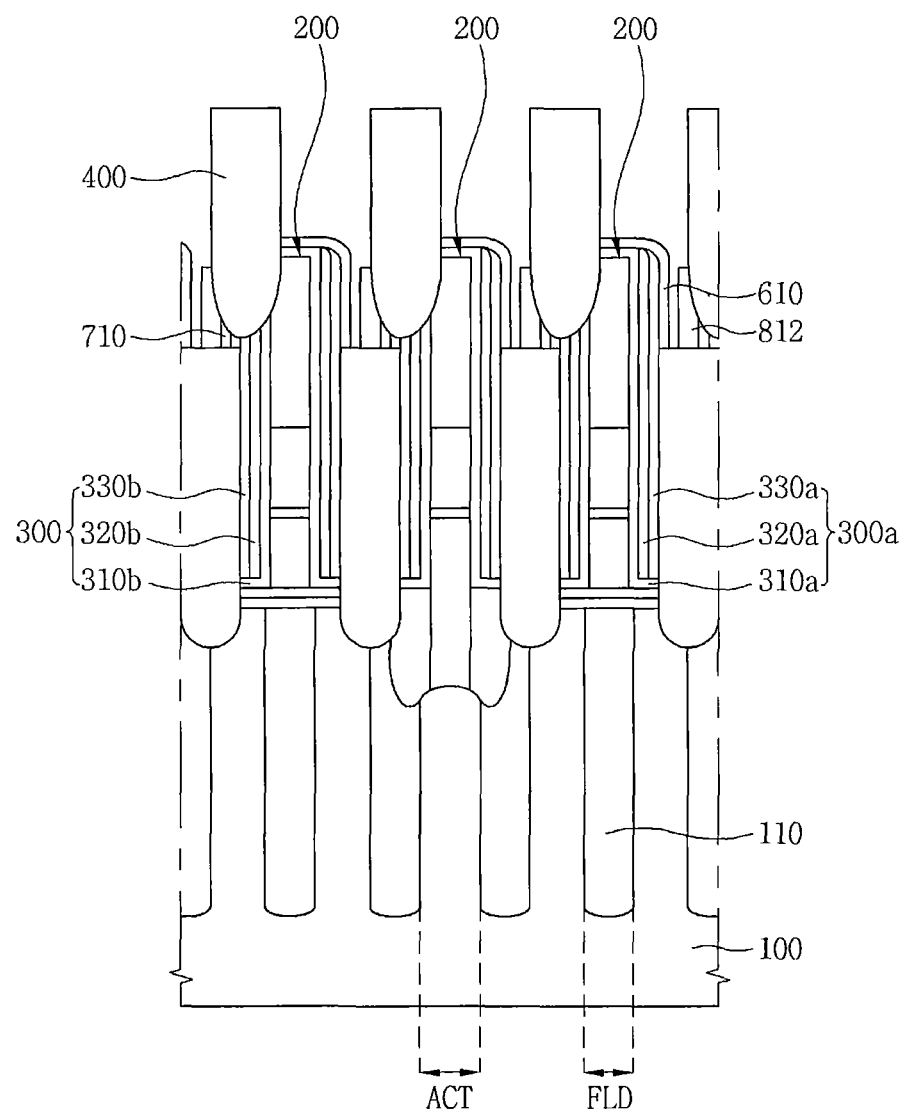

Referring to FIG. 5I, the method of forming the semiconductor device according to some embodiments of present inventive concepts may include a process of removing portions of the second plug separation spacers 710 that are exposed by the molding patterns 812. In the method of forming the semiconductor device according to some embodiments of present inventive concepts, the first plug separation spacers 610 and the second plug separation spacers 710 disposed on the second outer bit line spacers 330b may be covered by the interlayer insulating films 400. In the method of forming the semiconductor device according to some embodiments of present inventive concepts, the first plug separation spacers 610 and the second plug separation spacers 710 disposed on the second outer bit line spacers 330b may be surrounded by the second outer bit line spacers 330b, the interlayer insulating films 400, and the molding patterns 812. Accordingly, in the method of forming the semiconductor device according to some embodiments of present inventive concepts, portions of the second plug separation spacers 710 that are disposed on the second outer bit line spacers 330b may not be removed by the process of removing the portions of the second plug separation spacers 710 that are exposed by the molding patterns 812.

Figure 5J:
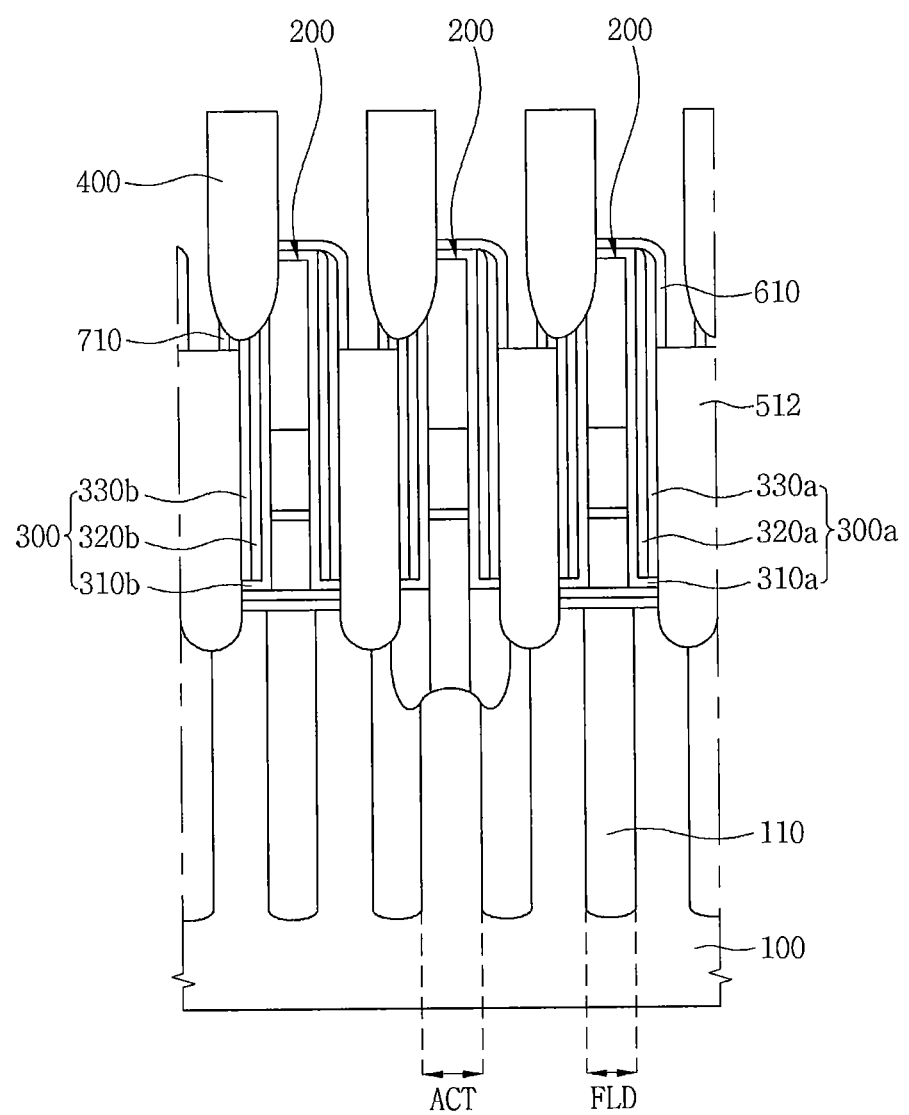

Referring to FIG. 5J, the method of forming the semiconductor device according to some embodiments of present inventive concepts may include a process of removing the molding patterns 812.

Figure 5K:
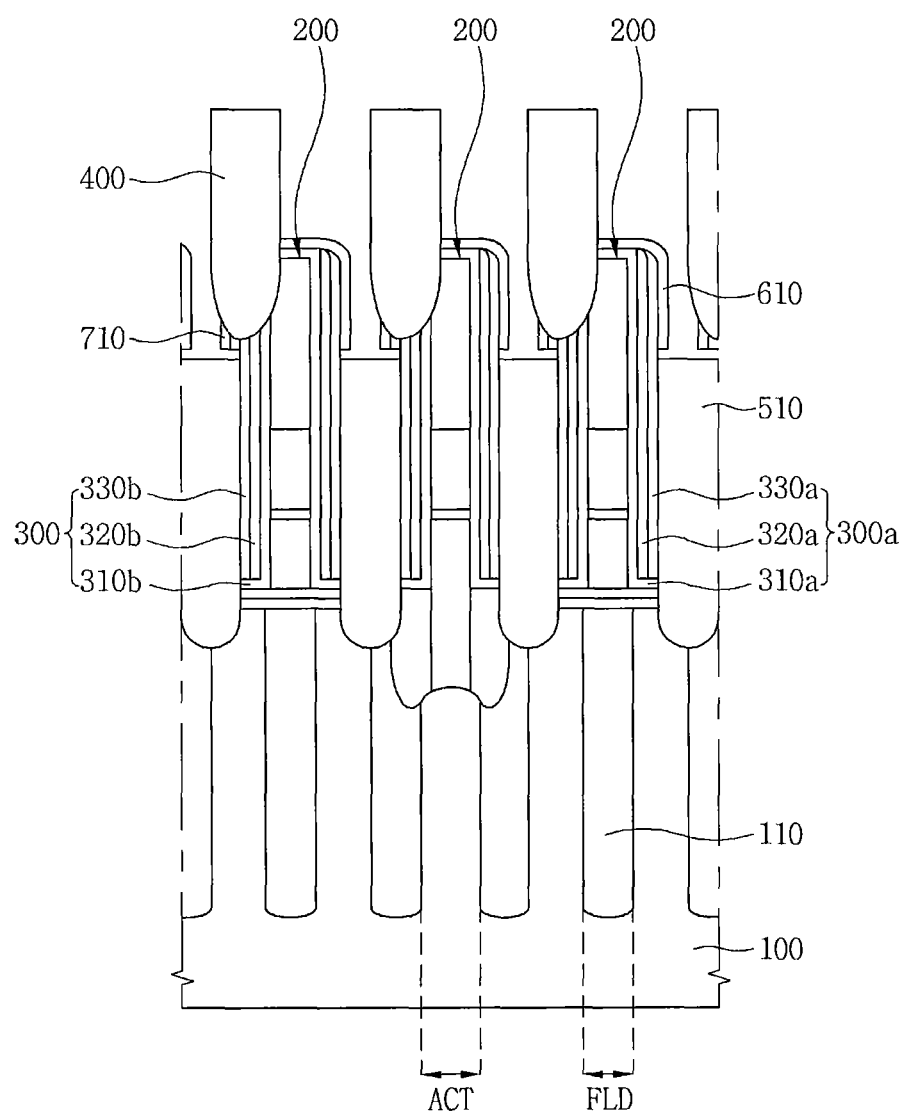

Referring to FIG. 5K, the method of forming the semiconductor device according to some embodiments of present inventive concepts may include a process of forming a lower plug pad 510. The process of forming the lower plug pad 510 may include a process of etching back the lower plug conductive pattern 512. For example, the process of forming the lower plug pad 510 may include a process of etching back the lower plug conductive pattern 512 such that a level of an upper surface of the lower plug conductive pattern 512 is lower than a level of a lower surface of the first plug separation spacer 610.

Figure 5L:
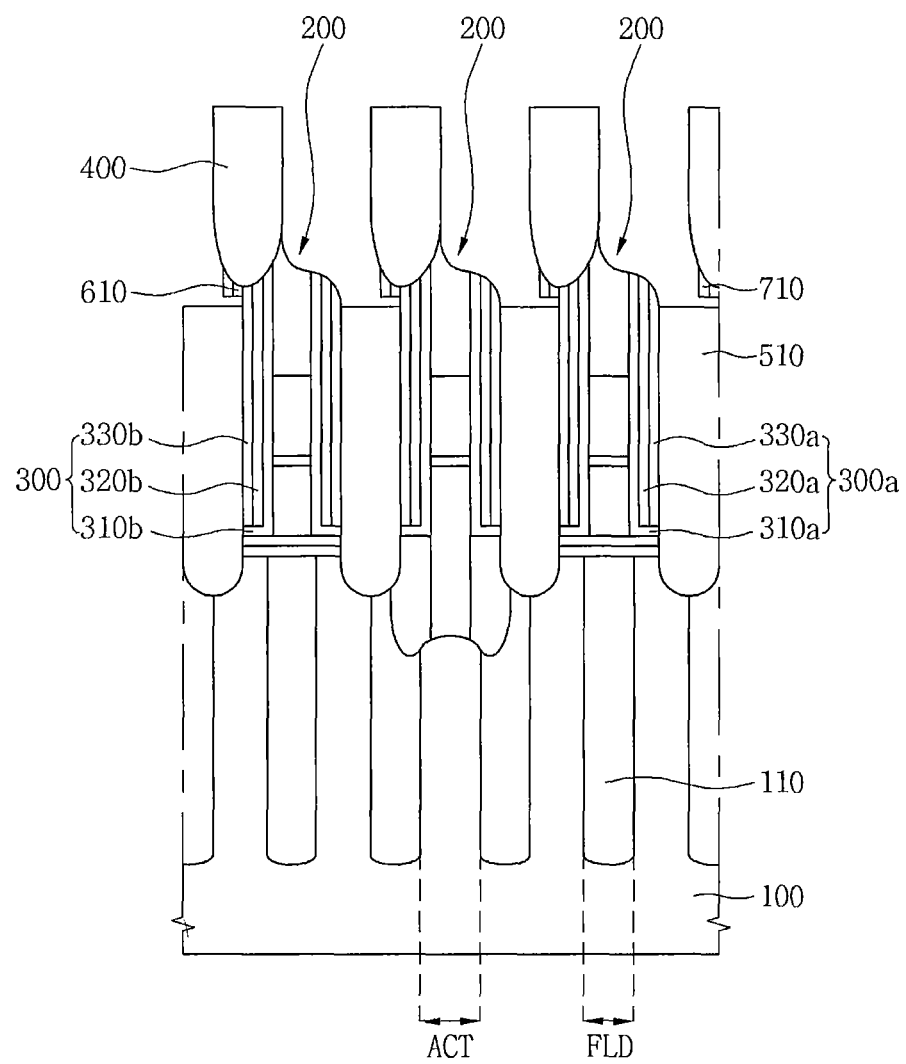

Referring to FIG. 5L, the method of forming the semiconductor device according to some embodiments of present inventive concepts may include a process of recessing upper end portions of the bit line structures 200. In the method of forming the semiconductor device according to some embodiments of present inventive concepts, portions of the first plug separation spacers 610 that are disposed on the first outer bit line spacers 330a may be removed by the process of recessing the upper end portions of the bit line structures 200.

Figure 5M:
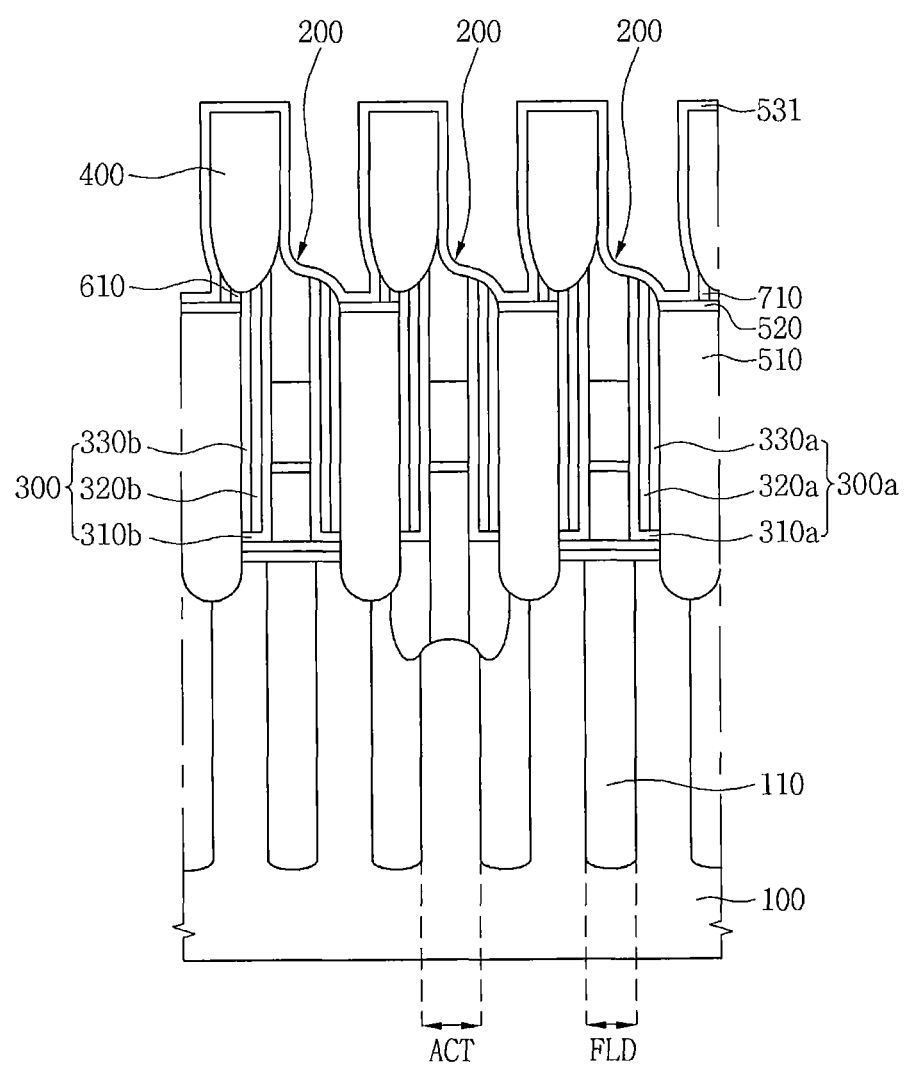

Referring to FIG. 5M, the method of forming the semiconductor device according to some embodiments of present inventive concepts may include a process of forming a middle plug pad 520 and a plug barrier film 531 on the lower plug pad 510. The process of forming the plug barrier film 531 may include a process of depositing an insulating material on the semiconductor substrate 100 including the middle plug pad 520. In the method of forming the semiconductor device according to some embodiments of present inventive concepts, the plug barrier film 531 may be formed on a side and an upper surface of the interlayer insulating film 400 by the process of forming the plug barrier film 531.

Referring to FIGS. 2A and 2B, the method of forming the semiconductor device according to some embodiments of present inventive concepts may include a process of forming storage contact plugs 500 between the interlayer insulating films 400. In the method of forming the semiconductor device according to some embodiments of present inventive concepts, the first plug separation spacers 610 and the second plug separation spacers 710 may be formed between the plug barrier patterns 530 of the storage contact plugs 500 and the second bit line spacers 300b. Accordingly, in the method of forming the semiconductor device according to some embodiments of present inventive concepts, adjacent storage contact plugs 500 can be fully spaced apart from each other.

FIGS. 6A to 6G are sequential sectional views illustrating a method of forming a semiconductor device sequentially according to some embodiments of present inventive concepts. A method of forming a semiconductor device according to some embodiments of present inventive concepts is described with reference to FIGS. 3A, 3B, and 6A to 6G. First, referring to FIG. 6A, the method of forming the semiconductor device according to some embodiments of present inventive concepts may include a process of forming bit line structures 200 on a semiconductor substrate 100 including an active region ACT and a field region FLD, a process of forming redundant inner bit line spacers 312 on the bit line structures 200, a process of forming first middle bit line spacers 320a and second middle bit line spacers 320b on the redundant inner bit line spacers 312, a process of forming first outer bit line spacers 330a on the first middle bit line spacers 320a, a process of forming second outer bit line spacers 330b on the second middle bit line spacers 320b, a process of forming lower plug pads 510 between the first outer bit line spacers 330a and the second outer bit line spacers 330b, and a process of forming middle plug pads 520 on upper surfaces of the lower plug pads 510.

Figure 6A:
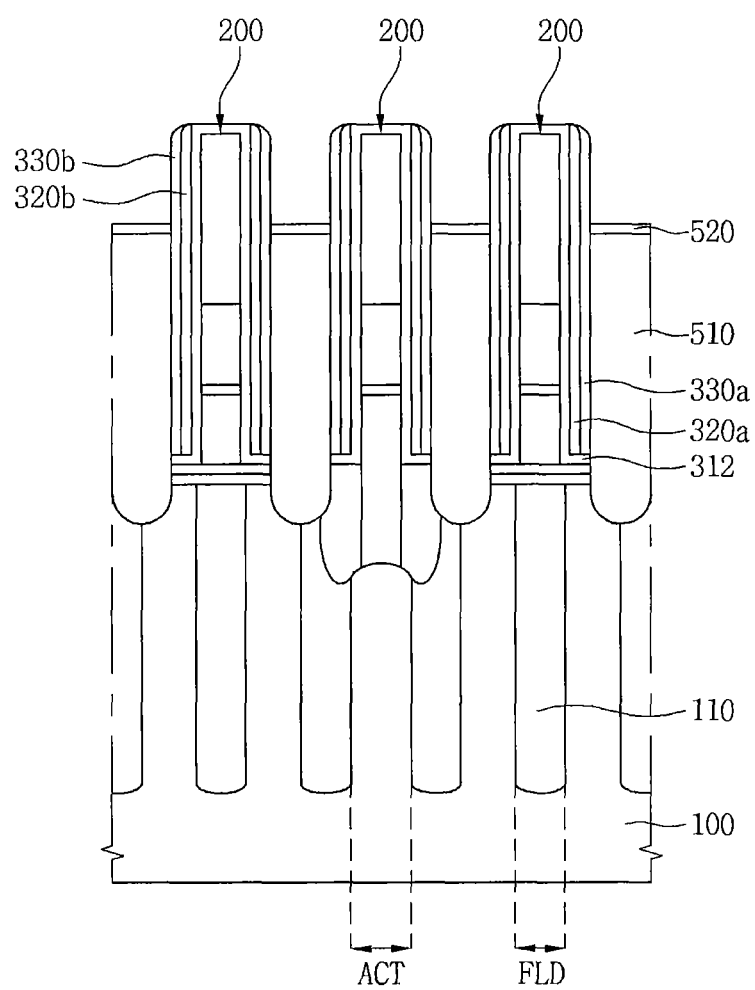
FIGS. 6A to 6G are sequential sectional views illustrating a method of forming a semiconductor device sequentially according to some embodiments of present inventive concepts.
Figure 6B:
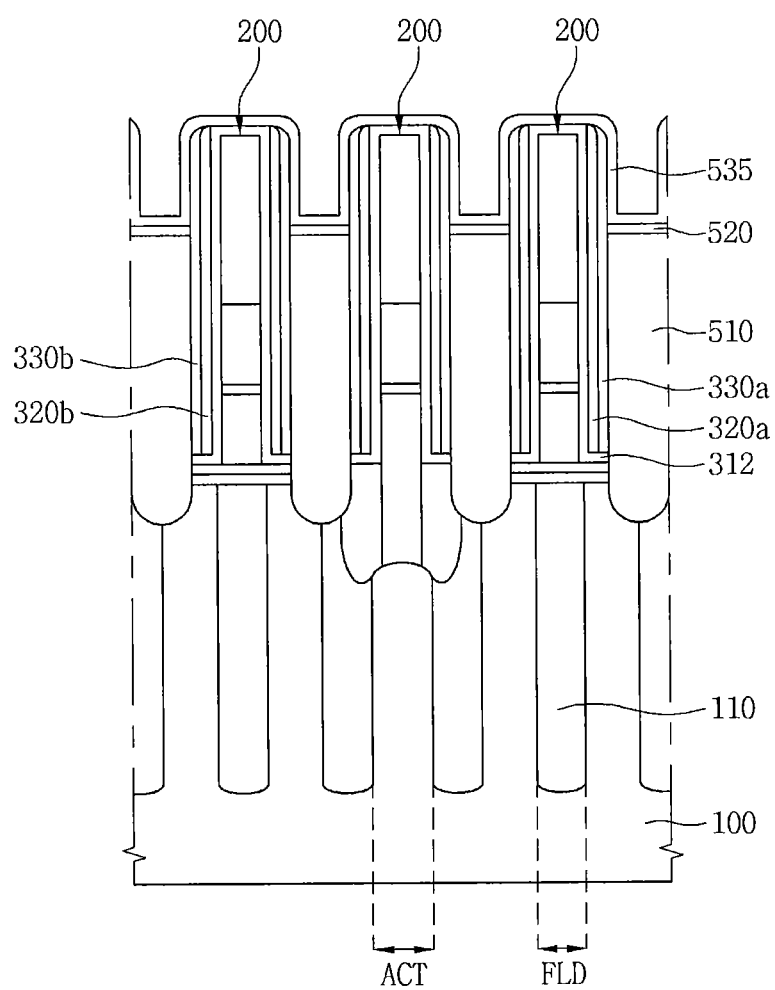

Referring to FIG. 6B, the method of forming the semiconductor device according to some embodiments of present inventive concepts may include a process of forming a sacrificial plug barrier film 535 on the middle plug pads 520. The process of forming the sacrificial plug barrier film 535 may include a process of forming a metal silicide layer on the semiconductor substrate 100 including the middle plug pads 520.

Figure 6C:
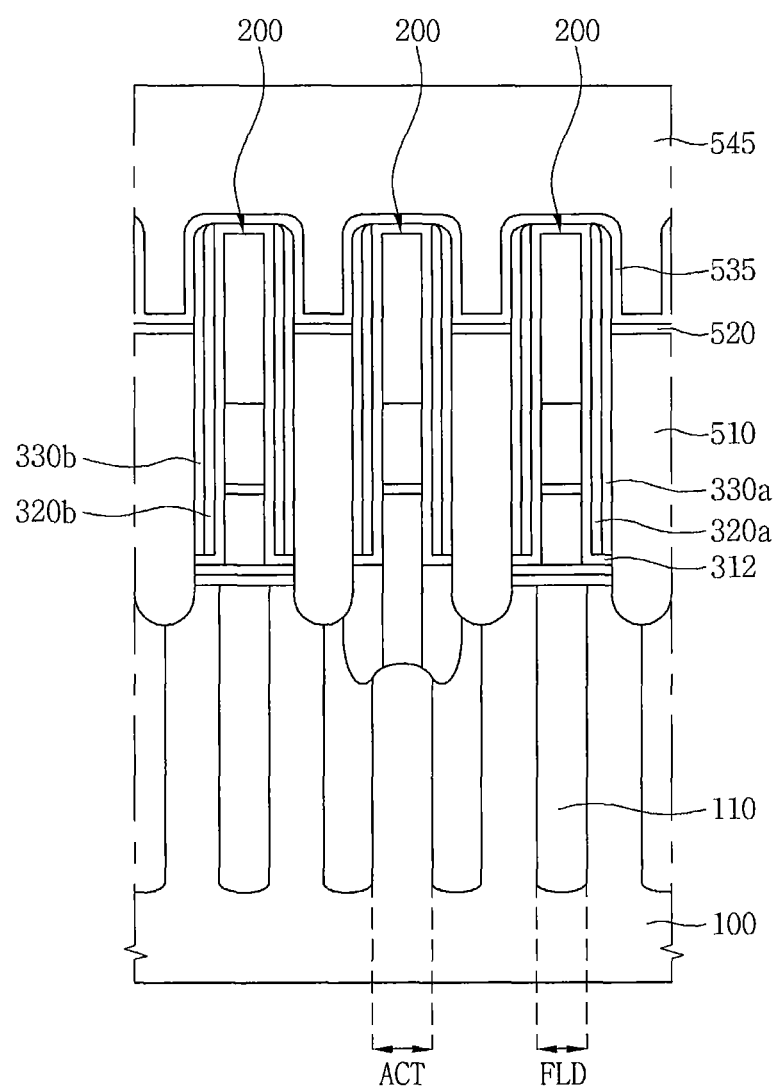

Referring to FIG. 6C, the method of forming the semiconductor device according to some embodiments of present inventive concepts may include a process of forming a sacrificial upper plug conductive film 545 on the sacrificial plug barrier film 535. The process of forming the sacrificial upper plug conductive film 545 may include a process of filling vertical regions of the sacrificial plug barrier film 535 with a conductive material. For example, the process of forming the sacrificial upper plug conductive film 545 may include a process of depositing a metal on the semiconductor substrate 100 including the sacrificial plug barrier film 535.

Figure 6D:
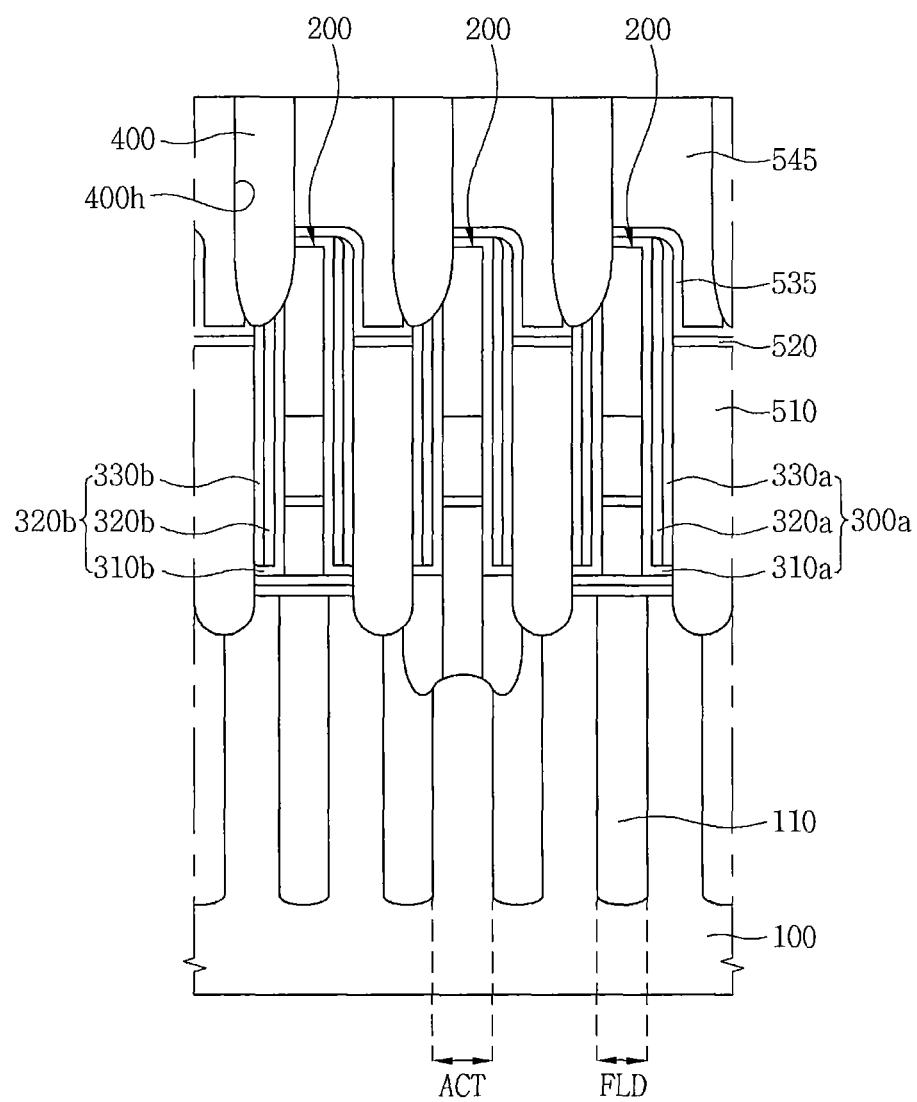

Referring to FIG. 6D, the method of forming the semiconductor device according to some embodiments of present inventive concepts may include a process of forming interlayer insulating films 400 in the sacrificial upper plug conductive film 545. The process of forming the interlayer insulating films 400 may include a process of forming isolating holes 400h in the sacrificial upper plug conductive film 545, and a process of forming the interlayer insulating films 400 in the isolating holes 400h. In the method of forming the semiconductor device according to some embodiments of present inventive concepts, first inner bit line spacers 310a and second inner bit line spacers 310b may be formed by the process of forming the isolating holes 400h.

Moreover, in the method of forming the semiconductor device according to some embodiments of present inventive concepts, first bit line spacers 300a may be formed by the formation of the first inner bit line spacers 310a. Further, in the method of forming the semiconductor device according to some embodiments of present inventive concepts, second bit line spacers 300b may be formed by the formation of the second inner bit line spacers 310b.

Figure 6E:
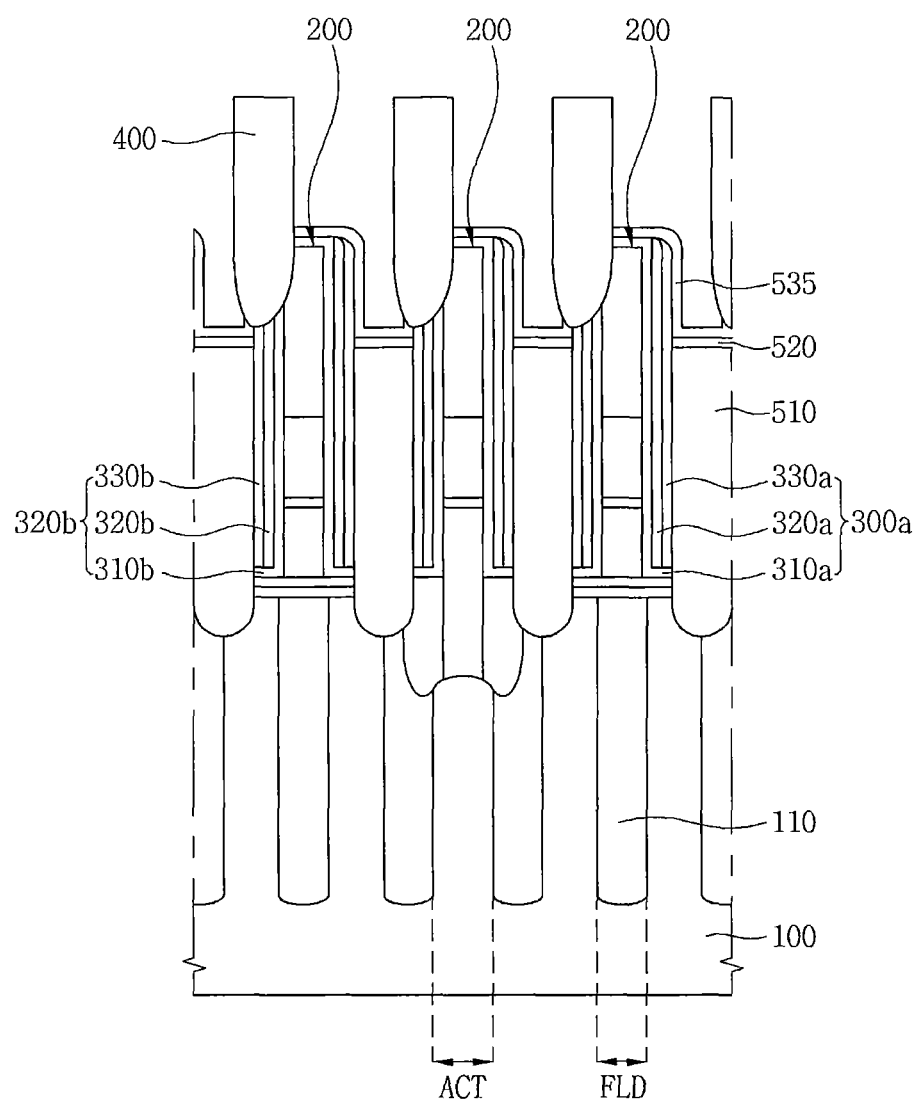

Referring to FIG. 6E, the method of forming the semiconductor device according to some embodiments of present inventive concepts may include a process of removing the sacrificial upper plug conductive film 545.

Figure 6F:
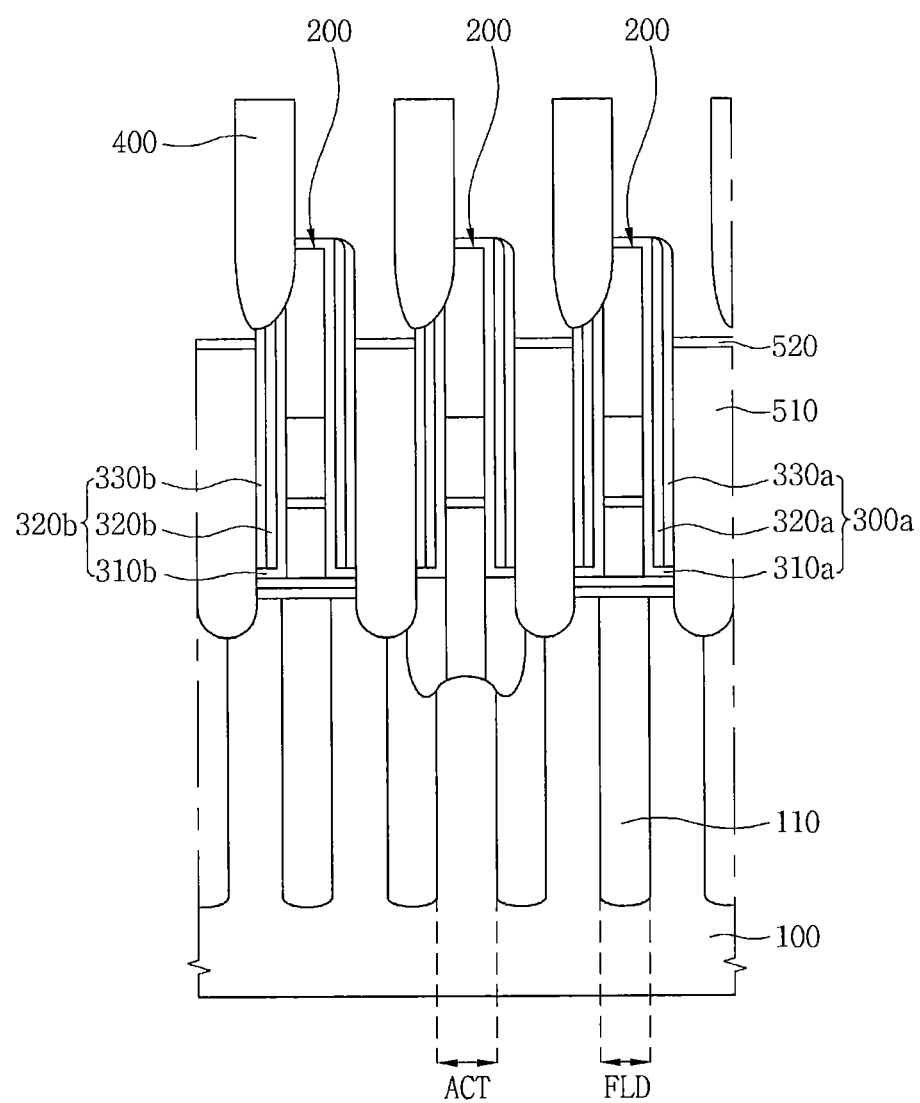

Referring to FIG. 6F, the method of forming the semiconductor device according to some embodiments of present inventive concepts may include a process of removing the sacrificial plug barrier film 535.

Figure 6G:
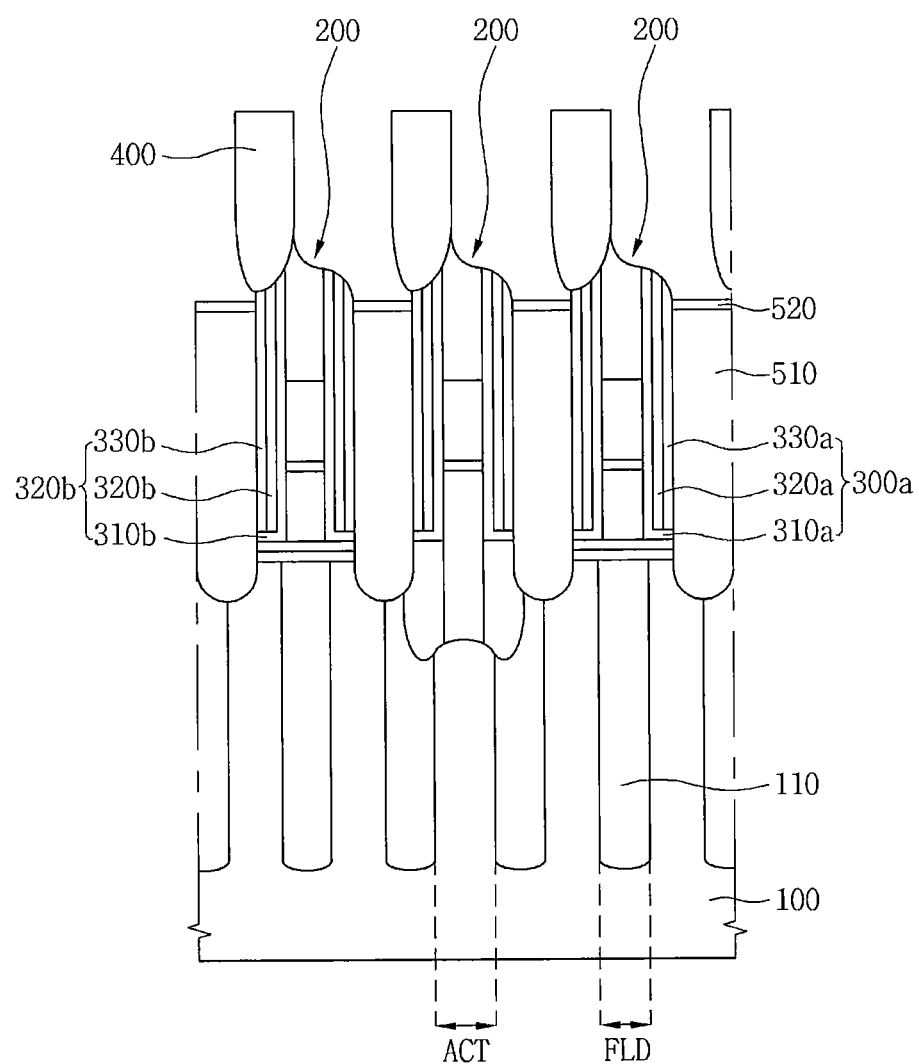

Referring to FIG. 6G, the method of forming the semiconductor device according to some embodiments of present inventive concepts may include a process of recessing upper end portions of the bit line structures 200.

Referring to FIGS. 3A and 3B, the method of forming the semiconductor device according to some embodiments of present inventive concepts may include a process of forming plug barrier patterns 530 and upper plug pads 540 on the middle plug pads 520.

Figure 7:
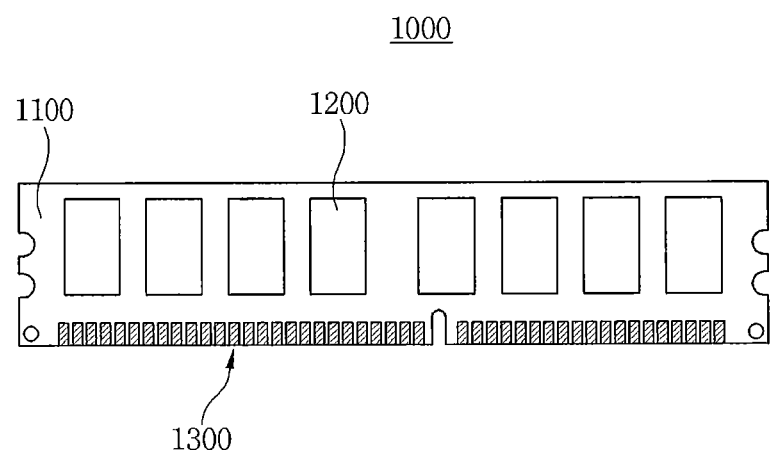
FIG. 7 is a diagram illustrating a memory module including a semiconductor device according to some embodiments of present inventive concepts.

FIG. 7 is a diagram illustrating a memory module including a semiconductor device according to some embodiments of present inventive concepts. Referring to FIG. 7, a memory module 1000 may include a module board 1100, semiconductor packages 1200, and module contact terminals 1300. The module board 1100 may be a system board. The semiconductor packages 1200 may be disposed in a line on the module board 1100. The semiconductor packages 1200 may be disposed on both surfaces of the module board 1100. The module contact terminals 1300 may be formed in a line on one edge of the module board 1100. The module contact terminals 1300 may be electrically connected to the semiconductor packages 1200.

The semiconductor packages 1200 may include semiconductor devices according to various embodiments of present inventive concepts. Accordingly, in the memory module 1000, reliability of the semiconductor packages 1200 can be improved.

Figure 8:
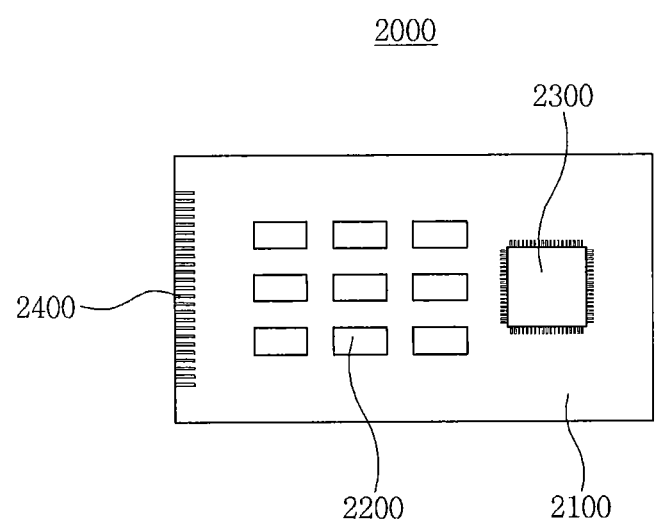
FIG. 8 is a diagram illustrating a semiconductor module including a semiconductor device according to some embodiments of present inventive concepts.

FIG. 8 is a diagram illustrating a semiconductor module including a semiconductor device according to some embodiments of present inventive concepts. Referring to FIG. 8, a semiconductor module 2000 may include a module board 2100, memories 2200, a microprocessor 2300, and input and output terminals 2400. The memories 2200, the microprocessor 2300, and the input and output terminals 2400 may be installed on the module board 2100. The semiconductor module 2000 may include a memory card or a card package.

The memories 2200 and the microprocessor 2300 may include semiconductor devices according to various embodiments of present inventive concepts. Accordingly, in the semiconductor module 2000 according to some embodiments of present inventive concepts, reliability of the memories 2200 and the microprocessor 2300 can be improved.

Figure 9:
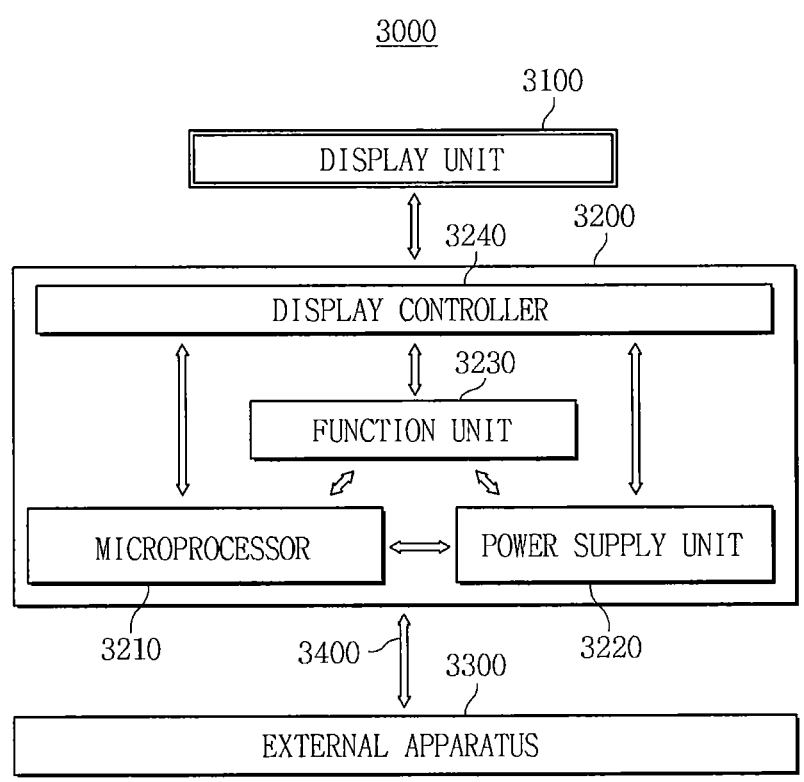
FIG. 9 is a block diagram illustrating a mobile system including a semiconductor device according to some embodiments of present inventive concepts.

FIG. 9 is a block diagram illustrating a mobile system including a semiconductor device according to some embodiments of present inventive concepts. Referring to FIG. 9, a mobile system 3000 may include a display unit 3100, a body unit 3200, and an external apparatus 3300. The body unit 3200 may include a microprocessor 3210, a power supply unit 3220, a function unit 3230, and a display controller 3240.

The display unit 3100 may be electrically connected with the body unit 3200. The display unit 3100 may be electrically connected with the display controller 3240 of the body unit 3200. The display unit 3100 may display an image processed by the display controller 3240 of the body unit 3200.

The body unit 3200 may be a system board or a motherboard including a printed circuit board (PCB). The microprocessor 3210, the power supply unit 3220, the function unit 3230, and the display controller 3240 may be mounted or installed on the body unit 3200.

The microprocessor 3210 may receive a voltage supplied from the power supply unit 3220, and control the function unit 3230 and the display controller 3240. The power supply unit 3220 may receive a constant voltage from an external power source, etc., and divide the constant voltage into various voltage levels to supply the microprocessor 3210, the function unit 3230, and the display controller 3240, etc. with the divided voltages.

The power supply unit 3220 may include a power management integrated circuit (PMIC). The PMIC may efficiently supply the microprocessor 3210, the function unit 3230, and the display controller 3240, etc. with voltages.

The function unit 3230 may perform various functions of the mobile system 3000. For example, the function unit 3230 may include various elements that can perform wireless communication functions, such as an image output to the display unit 3100, a sound output to a speaker, etc. by dialing or communication with an external apparatus 3300. For example, the function unit 3230 may function as an image processor of a camera.

The function unit 3230 may function as a memory card controller when the mobile system 3000 is connected to a memory card to increase capacity. The function unit 3230 may function as an interface controller when the mobile system 3000 may further include a universal serial bus (USB), etc.

The microprocessor 3210, the power supply unit 3220, and the function unit 3230 may include semiconductor devices according to various embodiments of present inventive concepts. Accordingly, reliability of the mobile system 3000 according to some embodiments of present inventive concepts can be improved.

Figure 10:
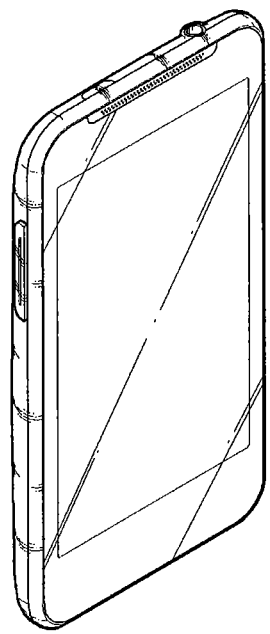
FIG. 10 is a conceptual diagram illustrating a mobile apparatus including a semiconductor device according to some embodiments of present inventive concepts.

FIG. 10 is a conceptual diagram illustrating a mobile apparatus including a semiconductor device according to some embodiments of present inventive concepts. Referring to FIG. 10, a mobile apparatus 4000 may be a mobile wireless phone. The mobile apparatus 4000 may be a tablet personal computer (PC) or any other tablet computer. The mobile apparatus 4000 may include semiconductor devices according to various embodiments of present inventive concepts. Accordingly, reliability of the mobile apparatus 4000 according to some embodiments of present inventive concepts can be improved.

Figure 11:
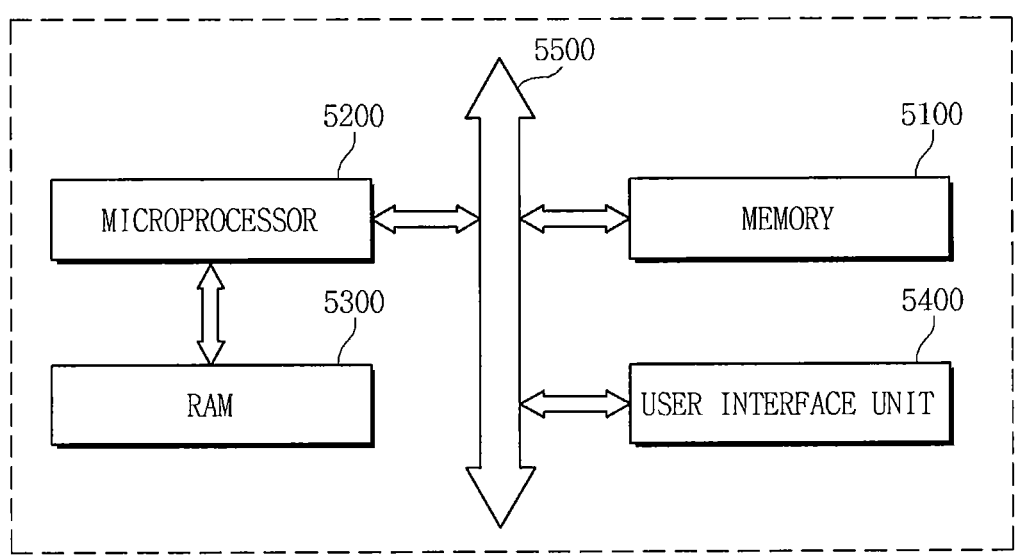
FIG. 11 is a block diagram illustrating an electronic system including a semiconductor device according to some embodiments of present inventive concepts.

FIG. 11 is a block diagram illustrating an electronic system including a semiconductor device according to some embodiments of present inventive concepts. Referring to FIG. 11, an electronic system 5000 may include a memory 5100, a microprocessor 5200, a random access memory (RAM) 5300, and a user interface unit 5400. The electronic system 5000 may be a system such as a light emitting diode (LED) lighting apparatus, a refrigerator, an air conditioner, an industrial cutting machine, a welding machine, an automobile, a ship, an airplane, a satellite, etc.

The memory 5100 may store codes for booting the microprocessor 5200, data processed by the microprocessor 5200, or external input data. The memory 5100 may include a controller.

The microprocessor 5200 may program and control the electronic system 5000. The RAM 5300 may be used as an operating memory of the microprocessor 5200.

The user interface unit 5400 may perform data communication through a bus 5500. The user interface unit 5400 may be used to input data to the electronic system 5000, or output data from the electronic system 5000.

The memory 5100, the microprocessor 5200, and the RAM 5300 may include semiconductor devices according to various embodiments of present inventive concepts. Accordingly, in the electronic system 5000 according to some embodiments of present inventive concepts, reliability of the memory 5100, the microprocessor 5200, and the RAM 5300 can be improved.

In the semiconductor device according to present inventive concepts, a shape of the lower surface of the storage contact plug that faces the upper surface of the bit line structure may be a convex shape. Accordingly, in the semiconductor device according to present inventive concepts, the storage contact plug can have a sufficient thickness overall. Further, reliability of the semiconductor device according to present inventive concepts can be improved.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:
   forming a bit line structure on a substrate;
   forming a bit line spacer on a sidewall of the bit line structure;
   forming a lower plug pad on the sidewall of the bit line structure, wherein the bit line spacer is between the bit line structure and the lower plug pad;
   recessing an upper portion of the bit line structure and an upper portion of the bit line spacer; and
   forming a upper plug pad on a recessed upper surface of the bit line structure and a recessed upper surface of the bit line spacer,
   wherein the recessed upper surface of the bit line structure slopes downward toward the sidewall of the bit line structure, and
   wherein the lower plug pad and the upper plug pad comprise respective portions of one contact plug.

2. The method of claim 1, wherein forming the lower plug pad comprises:
   forming a conductive layer on the sidewall of the bit line structure, wherein the bit line spacer is between the bit line structure and the conductive layer; and
   removing an upper portion of the conductive layer to expose at least a portion of the bit line spacer.

3. The method of claim 2, wherein forming the lower plug pad further comprises:
   forming a first separation spacer on the at least the portion of the bit line spacer that is exposed by the removing;
   forming a second separation spacer on the first separation spacer;
   forming a molding pattern on the second separation spacer, the molding pattern exposing at least a portion of the second separation spacer;
   removing the second separation spacer; and
   removing the molding pattern and a portion of the conductive layer that is below the molding pattern.

4. The method of claim 3, wherein the first separation spacer remains on the bit line spacer after the lower plug pad is formed.

5. The method of claim 4, wherein recessing the upper portion of the bit line structure and the upper portion of the bit line spacer comprises:
   removing the first separation spacer.

6. The method of claim 2, further comprising:
   before recessing the upper portion of the bit line structure and the upper portion of the bit line spacer;
   sequentially forming a sacrificial barrier layer and a sacrificial upper plug conductive layer covering the at least the portion of the bit line spacer that is exposed by the removing;
   forming an insulating pattern penetrating the sacrificial barrier layer and the sacrificial upper plug conductive layer by patterning the sacrificial barrier layer and the sacrificial upper plug conductive layer; and
   removing the sacrificial barrier layer and the sacrificial upper plug conductive layer,
   wherein the insulating pattern is formed on the sidewall of the bit line structure.

7. The method of claim 6, wherein recessing the upper portion of the bit line structure and the upper portion of the bit line spacer comprises:
   recessing portions of the bit line structure and the bit line spacer that are exposed by the insulating pattern.

8. The method of claim 1, further comprising:
   forming a plug barrier pattern extending along the recessed upper surface of the bit line structure and the recessed upper surface of the bit line spacer,
   wherein the plug barrier pattern extends between the upper plug pad and the lower plug pad.

9. The method of claim 8, wherein the upper plug pad, the lower plug pad, and the plug barrier pattern constitute a storage contact plug that is electrically connected to the substrate.

10. The method of claim 1,
    wherein the bit line structure comprises a bit line electrode and a capping pattern sequentially stacked on the substrate, and
    wherein recessing the upper portion of the bit line structure comprises recessing an upper portion of the capping pattern.

11. The method of claim 10, wherein the upper plug pad is on a recessed upper surface of the capping pattern.

12. The method of claim 1, further comprising forming an insulator directly on a first curved surface of the bit line structure, wherein recessing the upper portion of the bit line structure comprises forming a second curved surface of the bit line structure while the insulator is directly on the first curved surface of the bit line structure.

13. The method of claim 1, further comprising forming an insulator that directly contacts a side surface of the bit line structure, wherein forming the upper plug pad comprises forming the upper plug pad adjacent a sidewall of the insulator.

14. The method of claim 1, wherein an uppermost surface of the lower plug pad is exposed after recessing the upper portion of the bit line structure and the upper portion of the bit line spacer.

15. The method of claim 1,
    wherein the upper and lower plug pads comprise conductive upper and lower plug pads, respectively, and
    wherein forming the upper plug pad comprises forming the conductive upper plug pad to overlap a portion of the conductive lower plug pad.

16. The method of claim 1, wherein forming the upper plug pad comprises forming the upper plug pad on the recessed upper surface of the bit line structure that slopes downward toward the sidewall of the bit line structure.

17. A method of forming a semiconductor device, the method comprising:
    forming a bit line structure on a substrate;
    forming an insulating material on a first portion of an upper region of the bit line structure adjacent a first side of the bit line structure;
    recessing a second portion of the upper region of the bit line structure adjacent a second side of the bit line structure where the insulating material has not been formed; and
    forming a storage contact plug on the second portion of the upper region of the bit line structure that is recessed, without forming the storage contact plug on the first portion of the upper region of the bit line structure that comprises the insulating material thereon.

18. A method of forming a semiconductor device, the method comprising:
    forming first and second bit line structures that are laterally spaced apart from each other on a substrate;
    forming an insulating material on a first upper surface of the first bit line structure, without forming the insulating material on a second upper surface of the first bit line structure;
    recessing the second upper surface of the first bit line structure where the insulating material has not been formed; and
    forming a storage contact plug on the second upper surface of the first bit line structure that is recessed, without forming the storage contact plug on the first upper surface of the first bit line structure that comprises the insulating material thereon.

19. The method of claim 18, further comprising:
    forming a conductive material between a sidewall of the first bit line structure and a sidewall of the second bit line structure; and
    forming an opening in the conductive material that exposes the first upper surface of the bit line structure, before forming the insulating material,
    wherein forming the insulating material comprises forming the insulating material in the opening in the conductive material.

20. The method of claim 19, wherein recessing the second upper surface of the first bit line structure comprises recessing the conductive material, after forming the insulating material in the opening in the conductive material.

* * * * *